United States Patent
Sharon et al.

(10) Patent No.: US 11,023,380 B2
(45) Date of Patent: Jun. 1, 2021

(54) NON-VOLATILE STORAGE SYSTEM WITH FILTERING OF DATA SAMPLES FOR A MONITORED OPERATIONAL STATISTIC

(71) Applicant: WESTERN DIGITAL TECHNOLOGIES, INC., San Jose, CA (US)

(72) Inventors: Eran Sharon, Rishon Lezion (IL); Ariel Navon, Revava (IL); Shay Benisty, Beer Sheva (IL)

(73) Assignee: Western Digital Technologies, Inc., San Jose, CA (US)

(*) Notice: Subject to any disclaimer, the term of this patent is extended or adjusted under 35 U.S.C. 154(b) by 85 days.

(21) Appl. No.: 16/566,645

(22) Filed: Sep. 10, 2019

(65) Prior Publication Data
US 2021/0073133 A1    Mar. 11, 2021

(51) Int. Cl.
| G06F 12/00 | (2006.01) |
| G06F 12/0862 | (2016.01) |
| G06F 12/02 | (2006.01) |
| G11C 7/10 | (2006.01) |
| G11C 7/22 | (2006.01) |
| G06F 13/16 | (2006.01) |

(52) U.S. Cl.
CPC ...... *G06F 12/0862* (2013.01); *G06F 12/0246* (2013.01); *G06F 13/1668* (2013.01); *G11C 7/1036* (2013.01); *G11C 7/22* (2013.01)

(58) Field of Classification Search
CPC ............. G06F 12/0862; G06F 13/1668; G06F 12/0246; G11C 7/1036; G11C 7/22
USPC ........................................................ 711/213
See application file for complete search history.

(56) References Cited

U.S. PATENT DOCUMENTS

| 4,984,154 A | 1/1991 | Hanatani |
| 5,875,324 A * | 2/1999 | Tran ...................... G06F 9/3842 |
| | | 712/238 |
| 9,703,664 B1 | 7/2017 | Alshawabkeh |
| 9,927,983 B2 | 3/2018 | Benisty |
| (Continued) | | |

FOREIGN PATENT DOCUMENTS

| CN | 102298508 | 12/2011 |
| CN | 109388550 | 2/2019 |
| (Continued) | | |

OTHER PUBLICATIONS

PCT International Search Report dated Jul. 6, 2020, PCT Patent Application No. PCT/US2020/024080.
(Continued)

*Primary Examiner* — Mardochee Chery
(74) *Attorney, Agent, or Firm* — Vierra Magen Marcus LLP

(57) ABSTRACT

A non-volatile storage device includes a compact and efficient filter of data samples for a monitored statistic about operation of the storage device. The non-volatile storage device comprises a plurality of non-volatile memory cells and a control circuit connected to the non-volatile memory cells. The control circuit is configured to maintain at the non-volatile storage device a sum of samples of the statistic for a moving window of the samples such that during operation new samples are added to the sum and contributions from old samples are removed from the sum by the control circuit multiplying the sum by a weight when adding the new samples.

20 Claims, 14 Drawing Sheets

(56) References Cited

U.S. PATENT DOCUMENTS

| | | | |
|---|---|---|---|
| 2002/0184430 A1 | 12/2002 | Masaki | |
| 2009/0300465 A1* | 12/2009 | Wu | G11C 11/5642 |
| | | | 714/763 |
| 2013/0275669 A1 | 10/2013 | Puttaswamy | |
| 2017/0255399 A1* | 9/2017 | Yang | G06F 3/064 |
| 2018/0246806 A1 | 8/2018 | Attaluri et al. | |
| 2019/0129834 A1 | 5/2019 | Purkayastha | |
| 2019/0258585 A1 | 8/2019 | Marcu et al. | |

FOREIGN PATENT DOCUMENTS

| | | |
|---|---|---|
| KR | 10-2009-0082781 | 7/2009 |
| WO | 2016165542 | 10/2016 |

OTHER PUBLICATIONS

PCT Written Opinion of the International Searching Authority dated Jul. 6, 2020, PCT Patent Application No. PCT/US2020/024080.

* cited by examiner

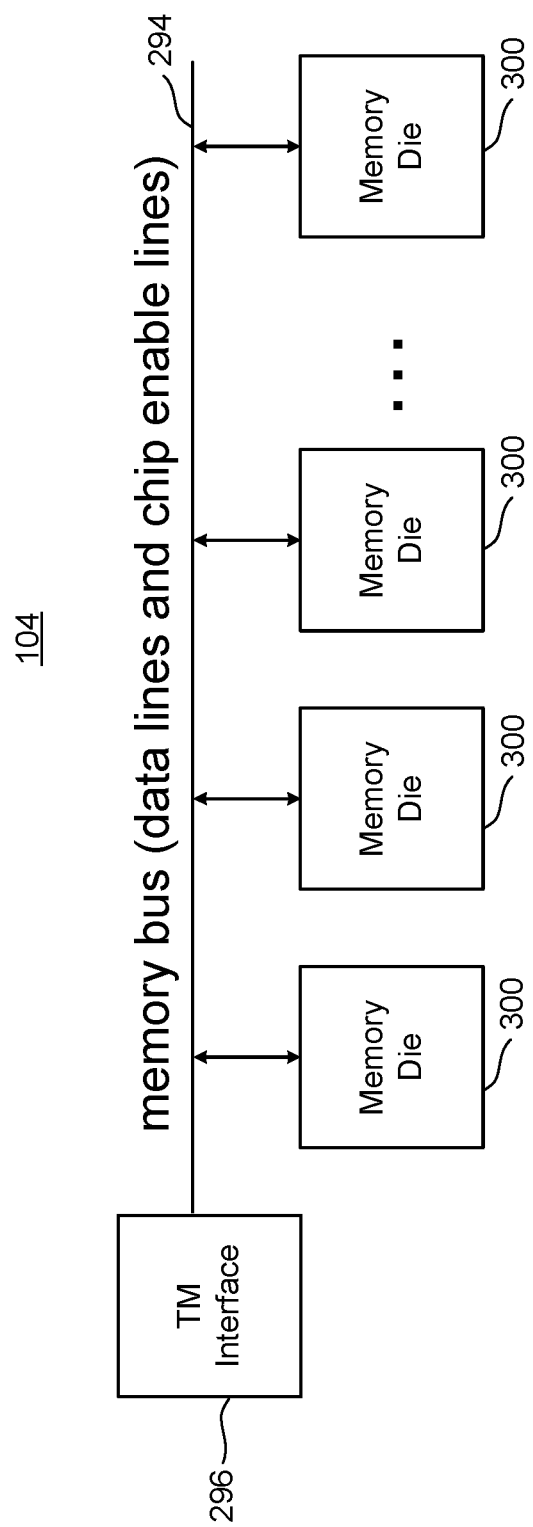

NON-VOLATILE STORAGE SYSTEM WITH FILTERING OF DATA SAMPLES FOR A MONITORED OPERATIONAL STATISTIC

BACKGROUND

Semiconductor memory is widely used in various electronic devices such as cellular telephones, digital cameras, personal digital assistants, medical electronics, mobile computing devices, laptop computers, desktop computers, servers, solid state drives, non-mobile computing devices and other devices. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory), Electrically Erasable Programmable Read-Only Memory (EEPROM), and others.

BRIEF DESCRIPTION OF THE DRAWINGS

Like-numbered elements refer to common components in the different figures.

In some embodiments, the Front End Processor Circuit is part of a controller.

Figure 1A:
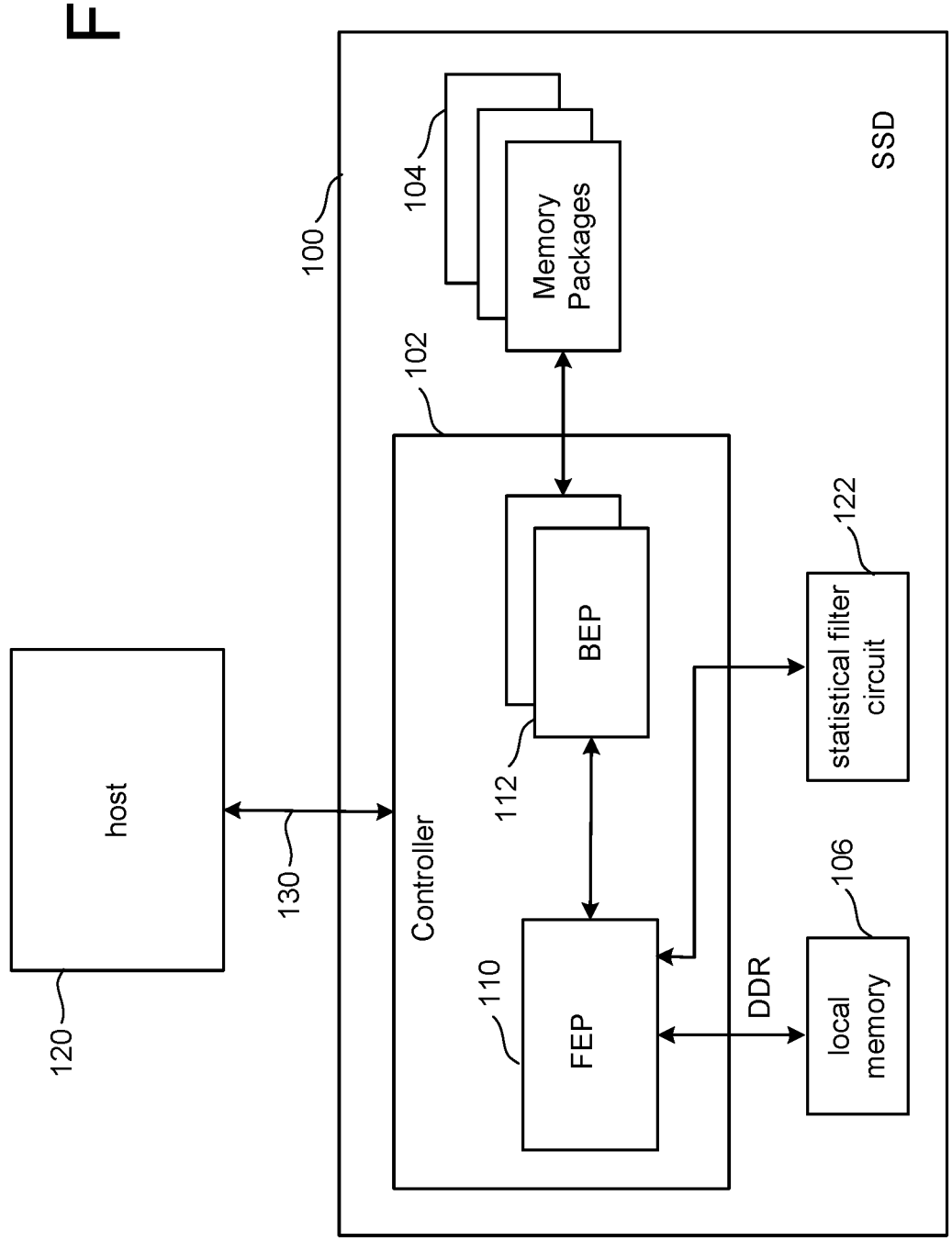
FIG. 1A is a block diagram of one embodiment of a storage device connected to a host.
Figure 1B:
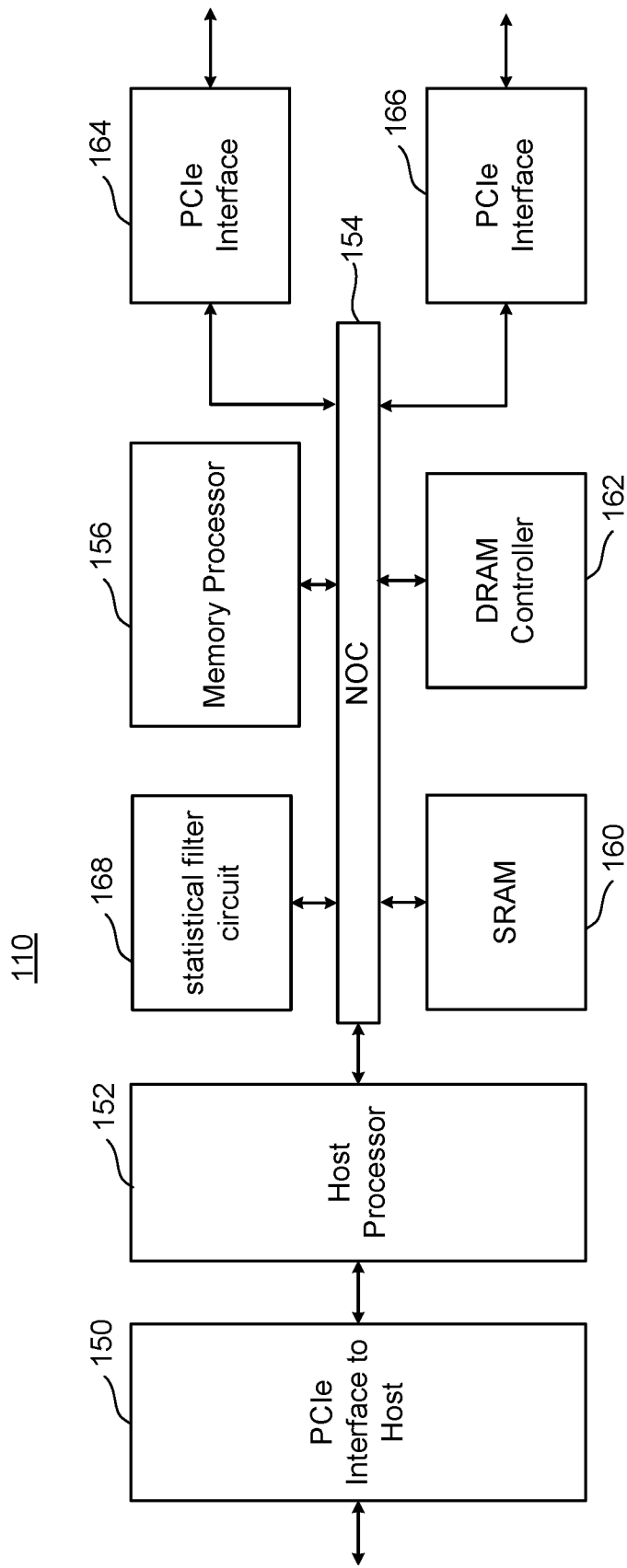
FIG. 1B is a block diagram of one embodiment of a Front End Processor Circuit.
Figure 1C:
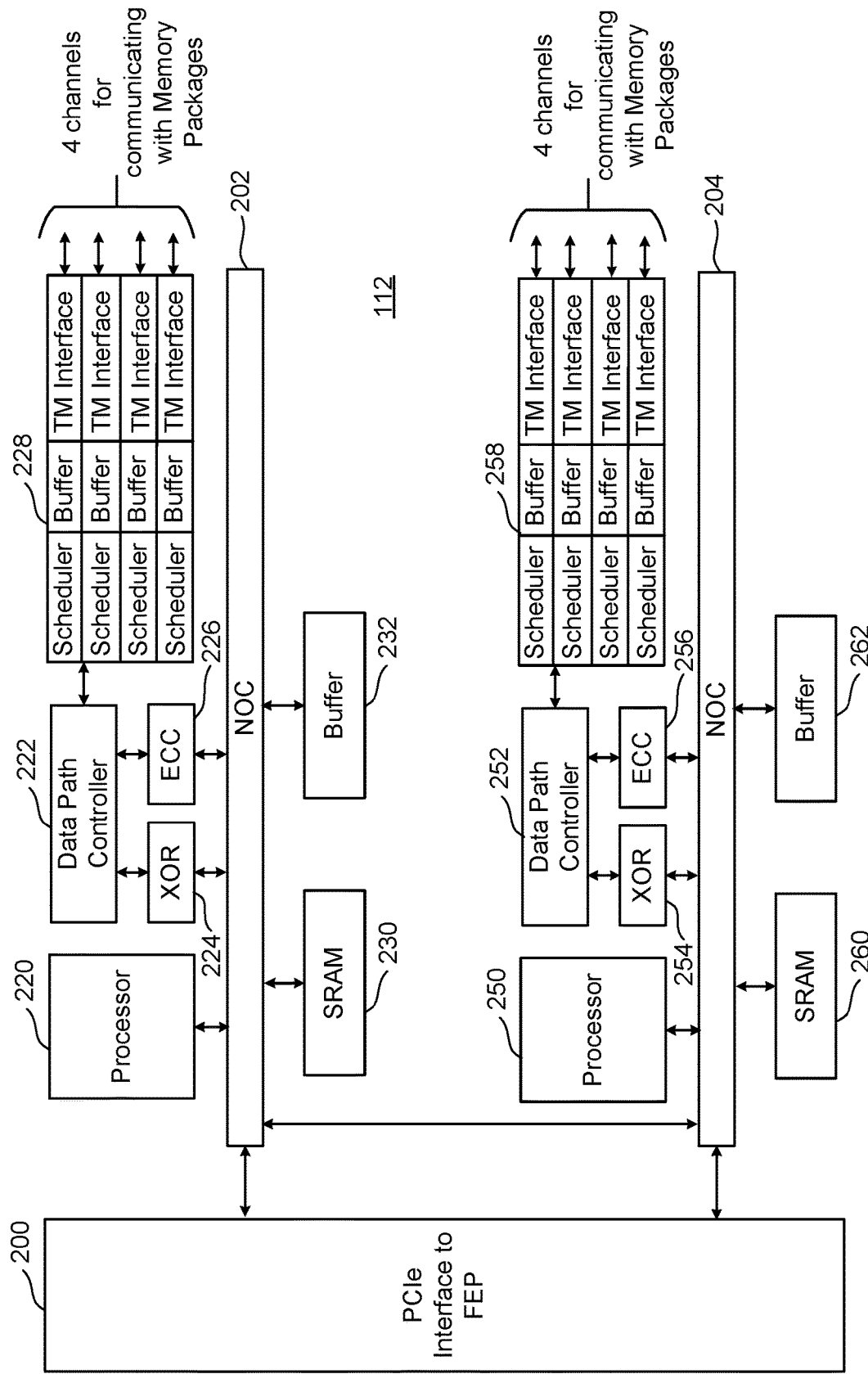

FIG. 1C is a block diagram of one embodiment of a Back End Processor Circuit.

In some embodiments, the Back End Processor Circuit is part of a controller.

FIG. 1D is a block diagram of one embodiment of a memory package.

Figure 2:
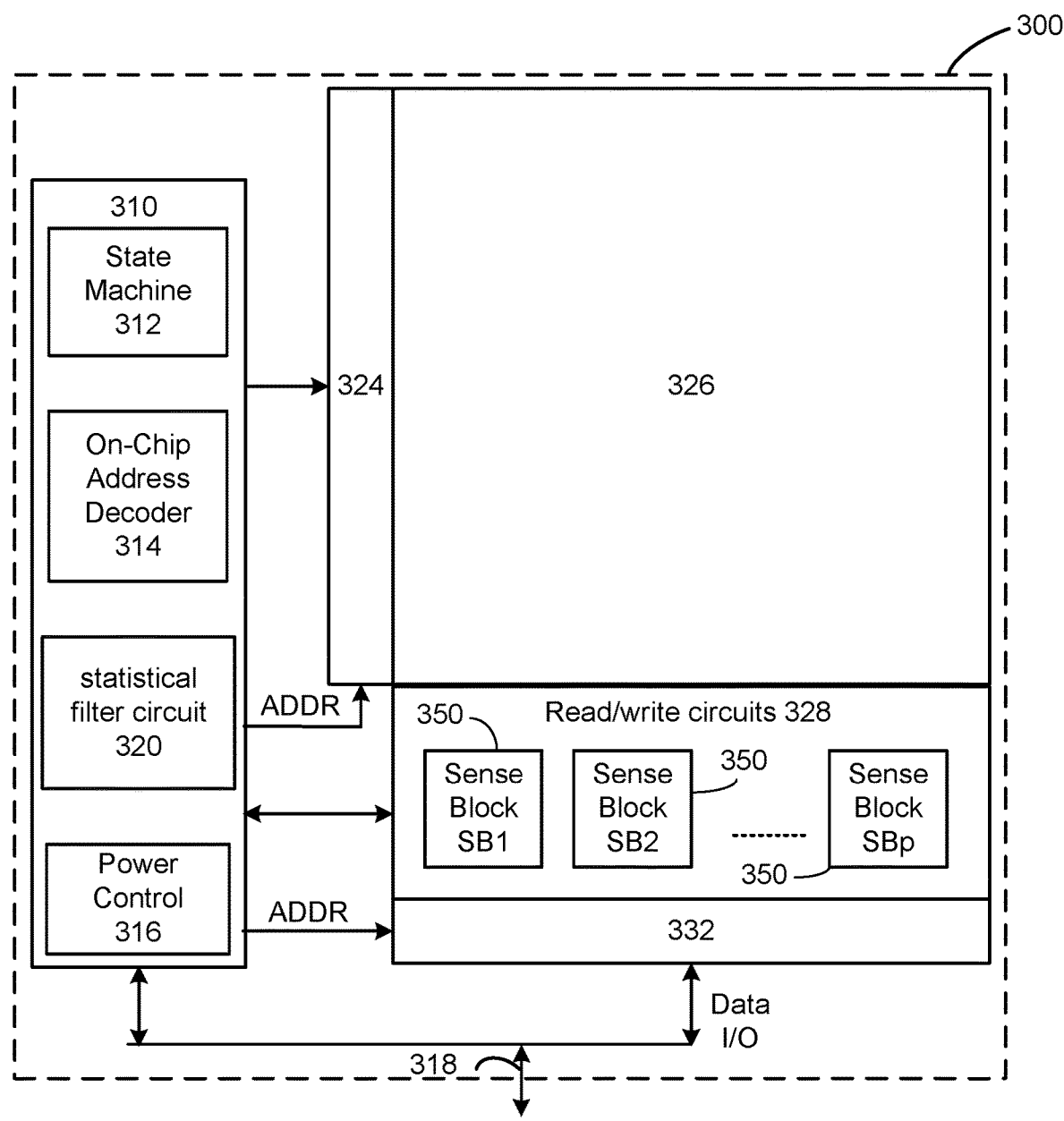

FIG. 2 is a block diagram of one embodiment of a memory die.

Figure 3:
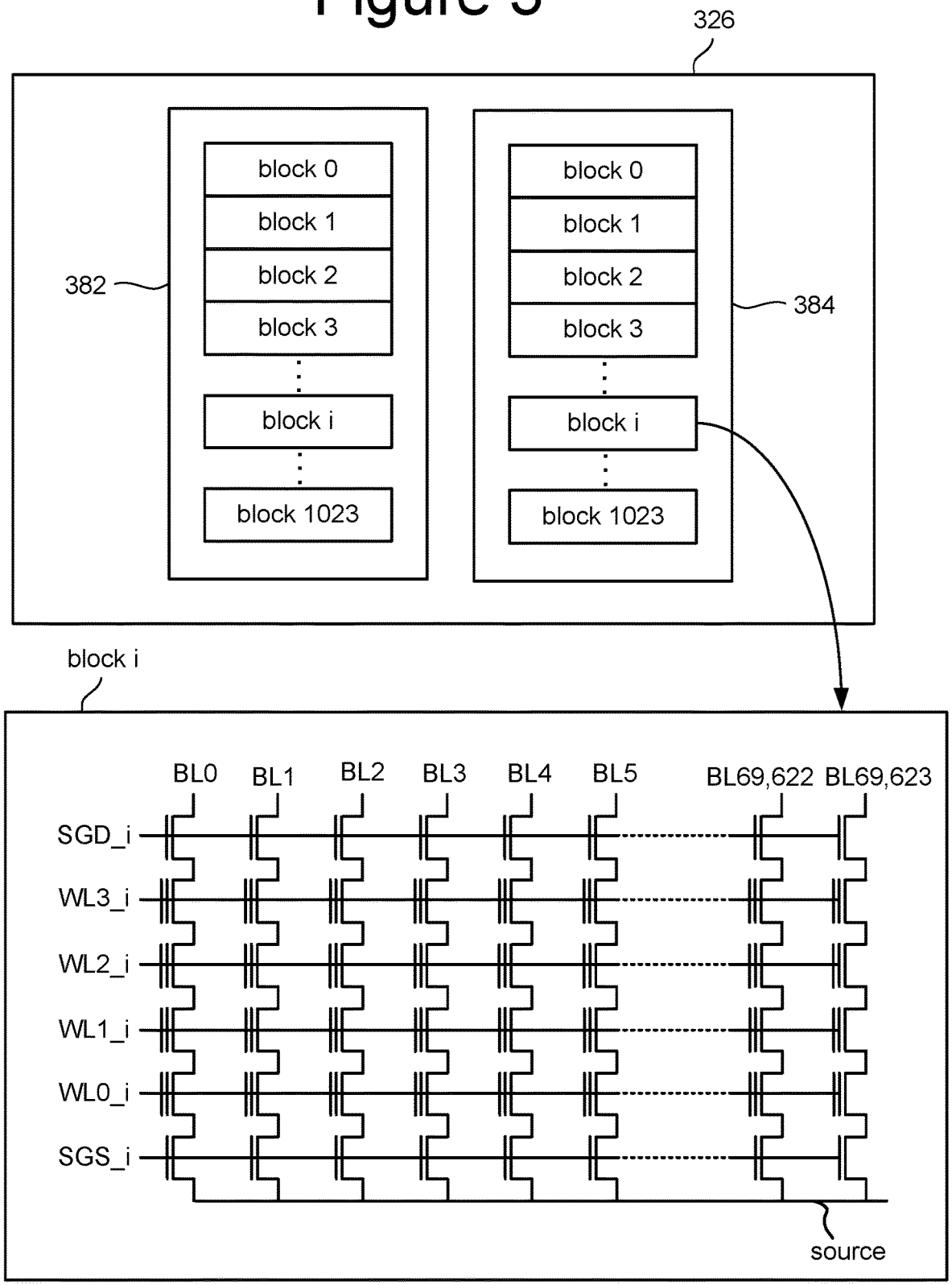

FIG. 3 is a block diagram that depicts details of a non-volatile memory structure.

Figure 4:
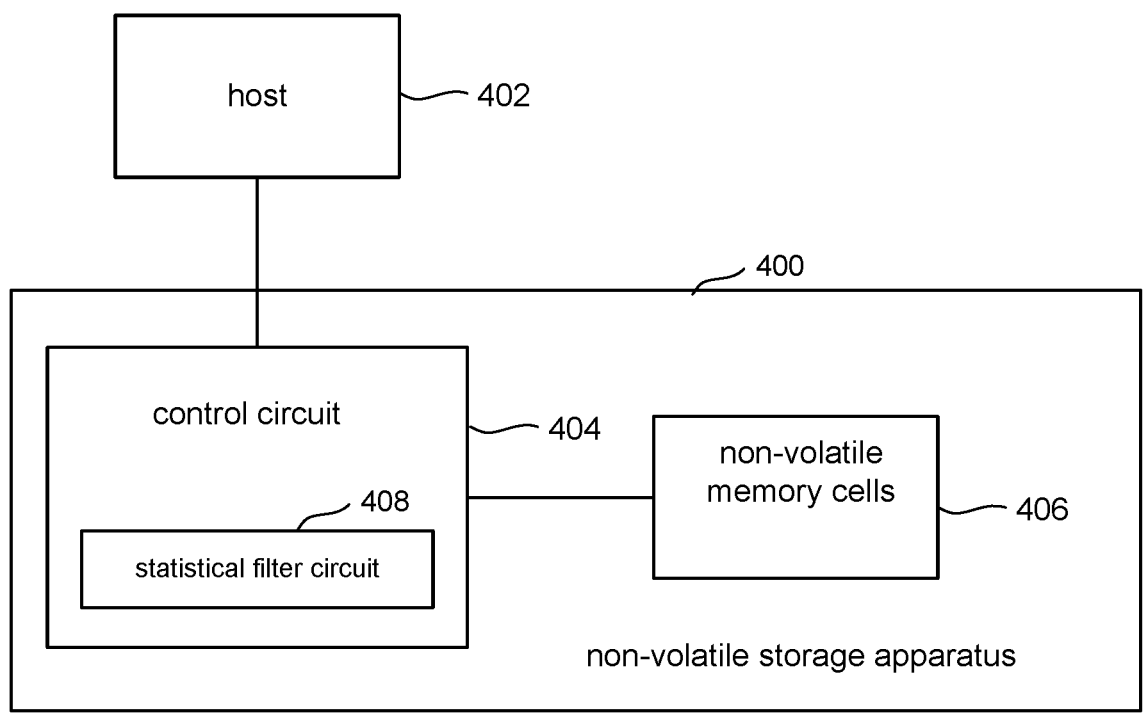

FIG. 4 is a block diagram of one embodiment of a storage device connected to a host.

Figure 5:
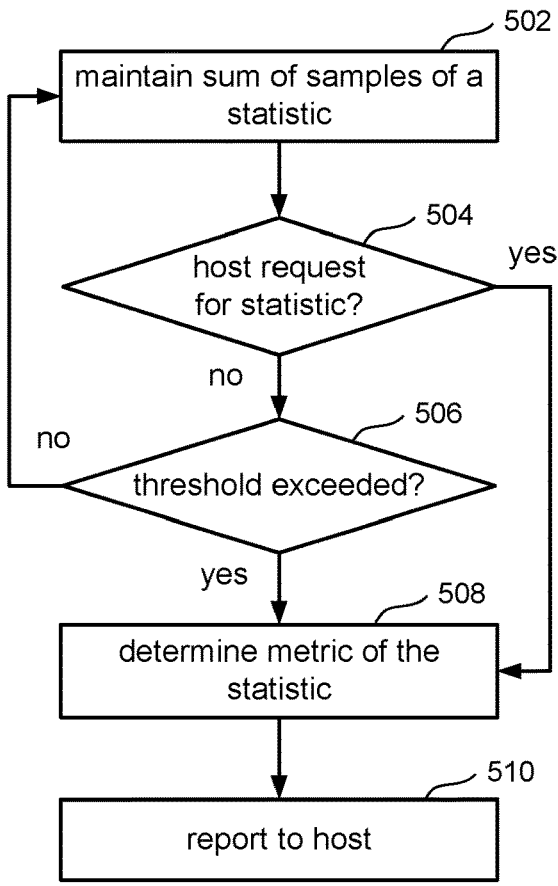

FIG. 5 is a flow chart describing one embodiment of a process for operating a non-volatile storage device including filtering of data samples and reporting a metric for a monitored statistic about operation of the storage device.

Figure 6:
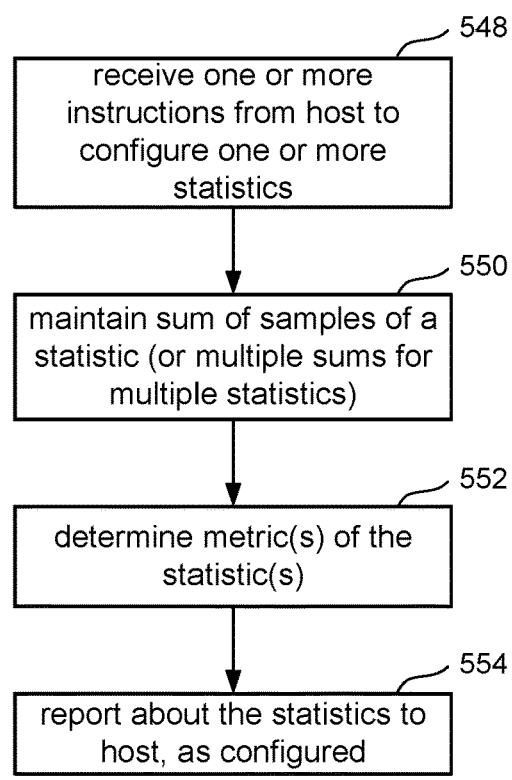

FIG. 6 is a flow chart describing one embodiment of a process for operating a non-volatile storage device including filtering of data samples and reporting a metric for a monitored statistic about operation of the storage device.

Figure 6A:
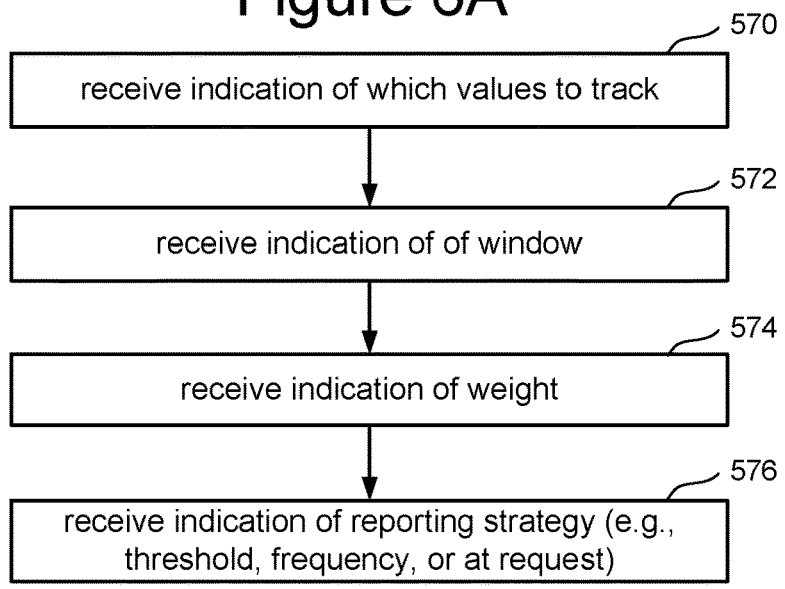

FIG. 6A is a flow chart describing one embodiment of a process for receiving one or more instructions from host to configure one or more statistics.

Figure 7:
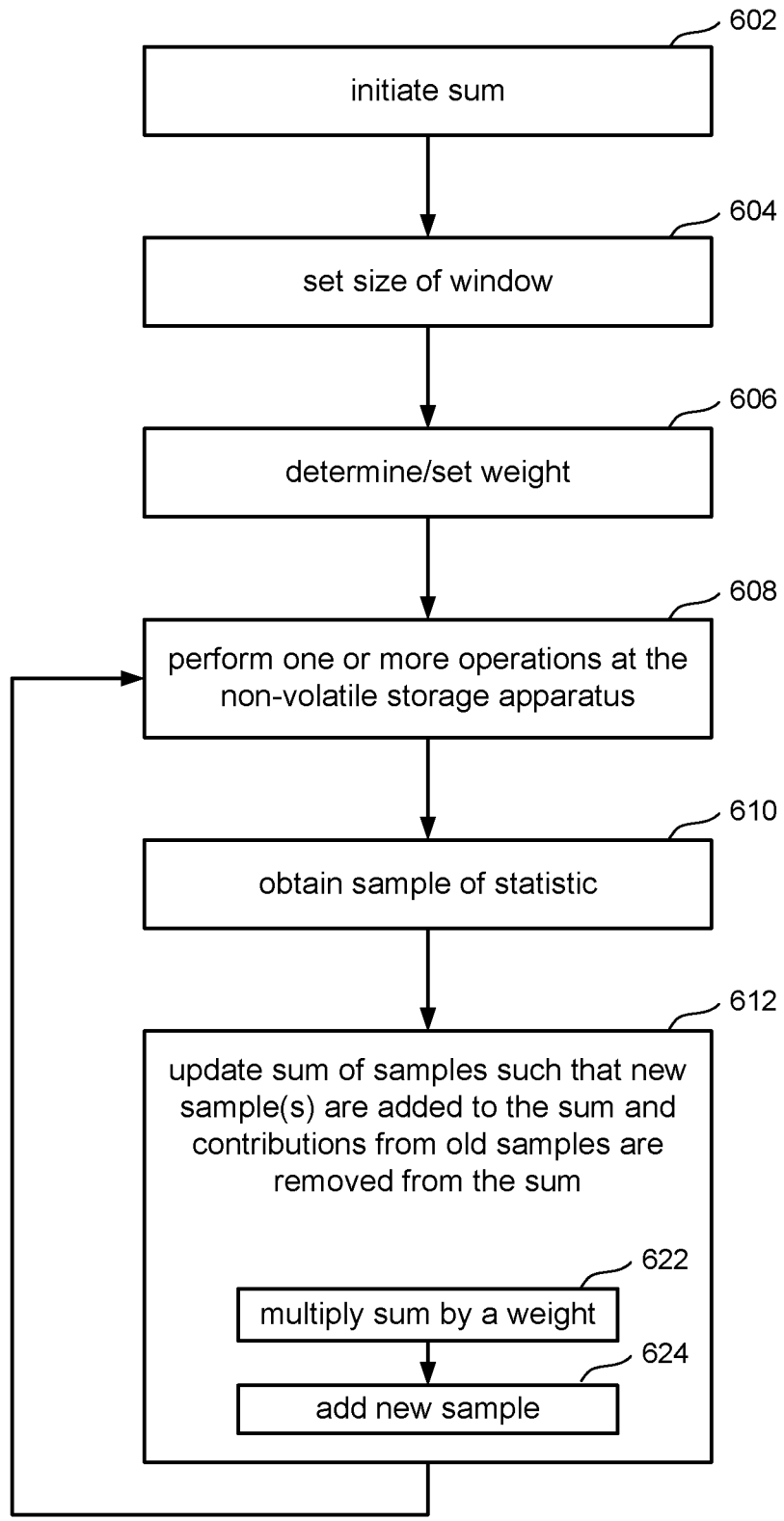

FIG. 7 is a flow chart describing one embodiment of a process for maintaining a sum of samples of a statistic about operation of the storage device.

Figure 8:
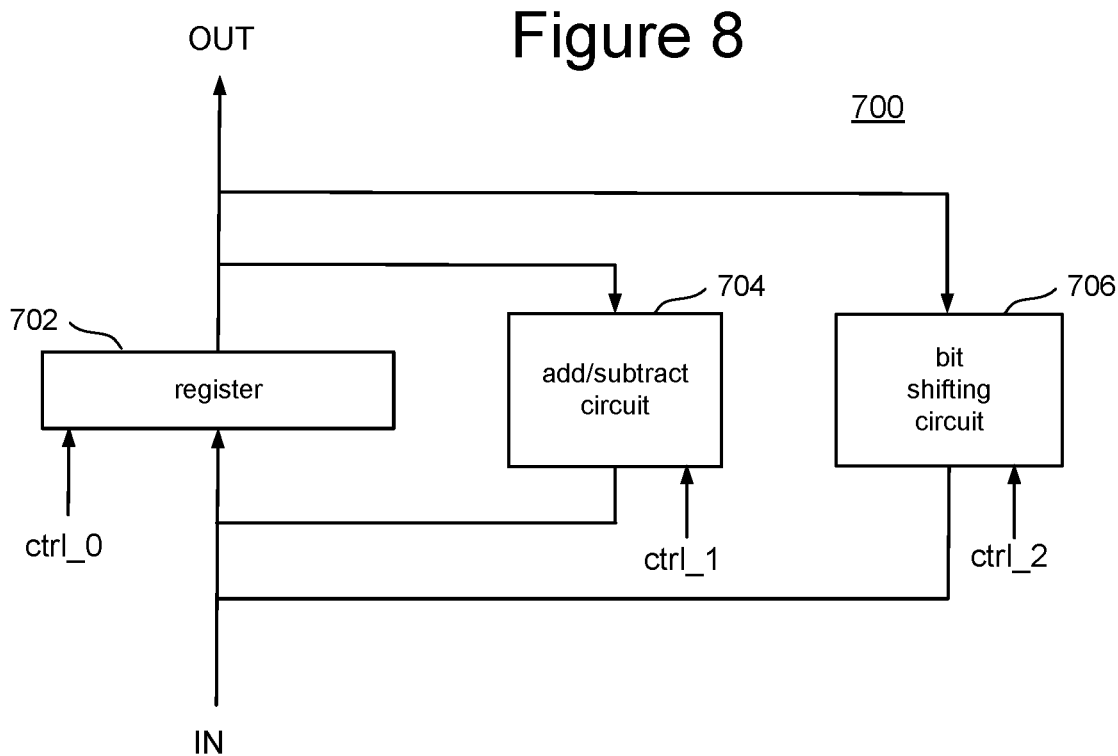

FIG. 8 is a block diagram of a statistical filter circuit.

Figure 9:
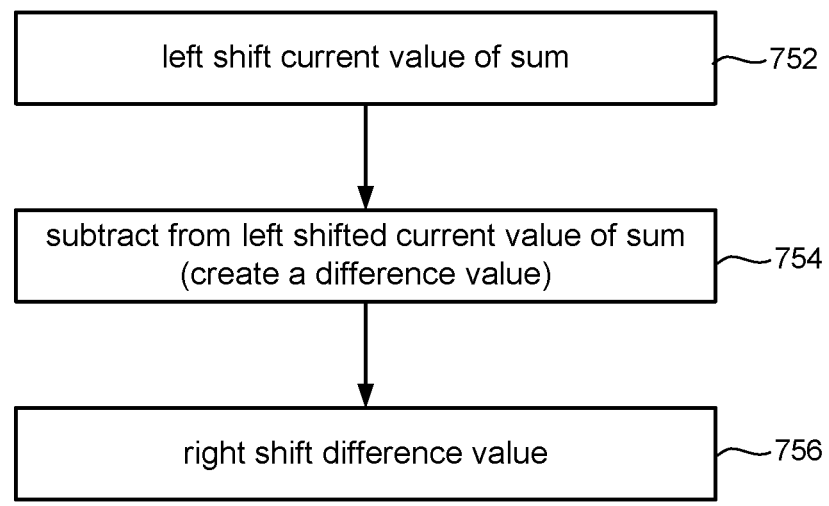

FIG. 9 is a flow chart describing one embodiment of a process for multiplying a sum by a weight.

Figure 10:
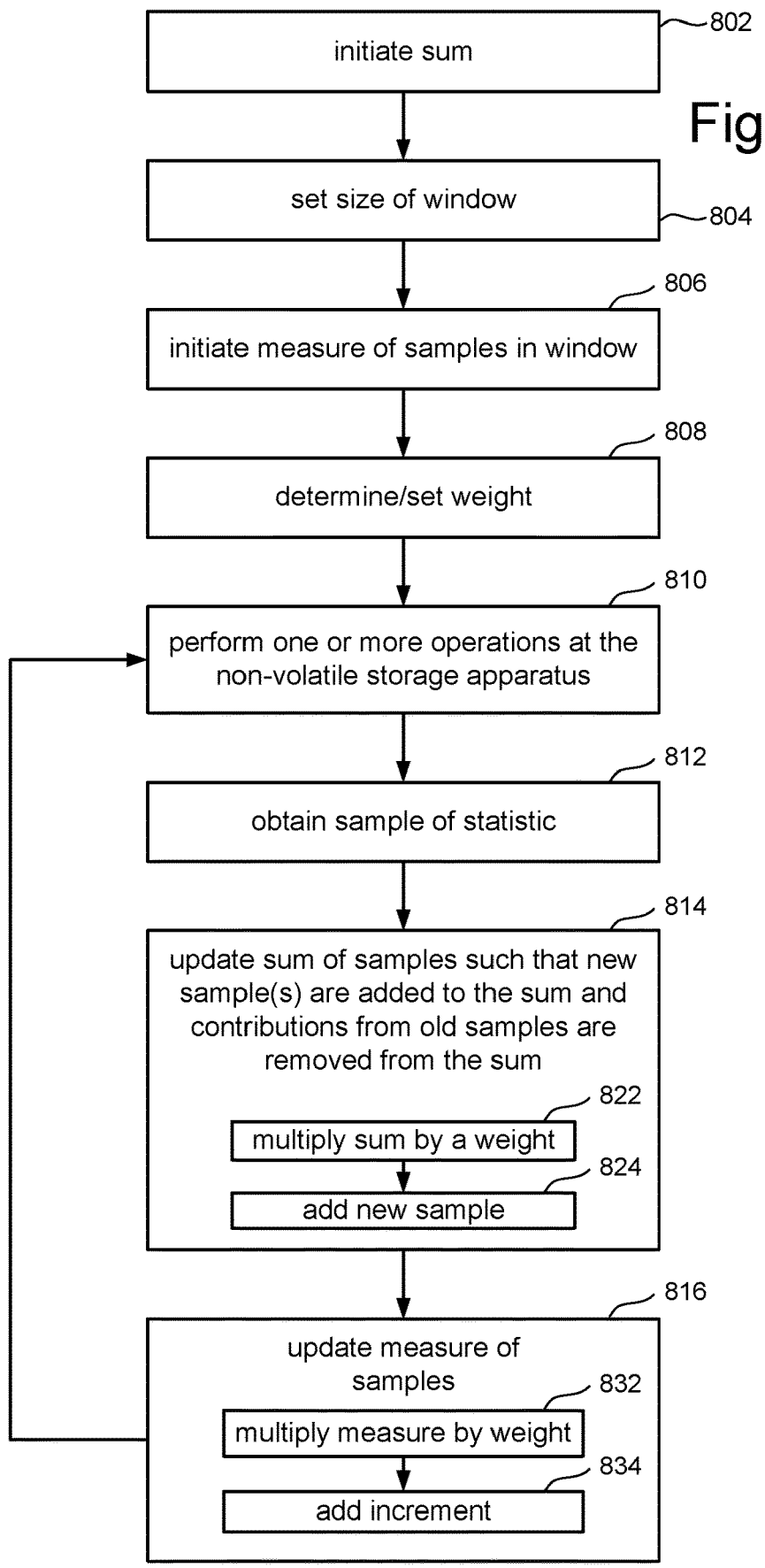

FIG. 10 is a flow chart describing one embodiment of a process for maintaining a sum of samples of a statistic about operation of the storage device.

Figure 11:
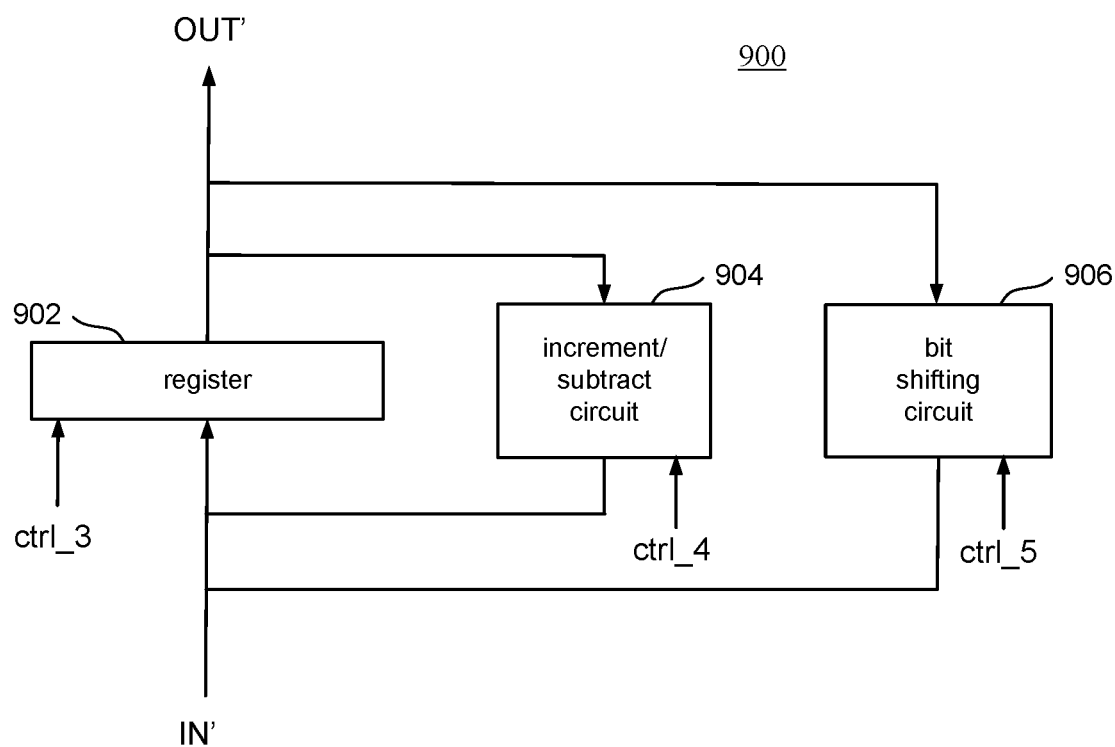

FIG. 11 is a block diagram of a register and a supporting circuit.

Figure 12:
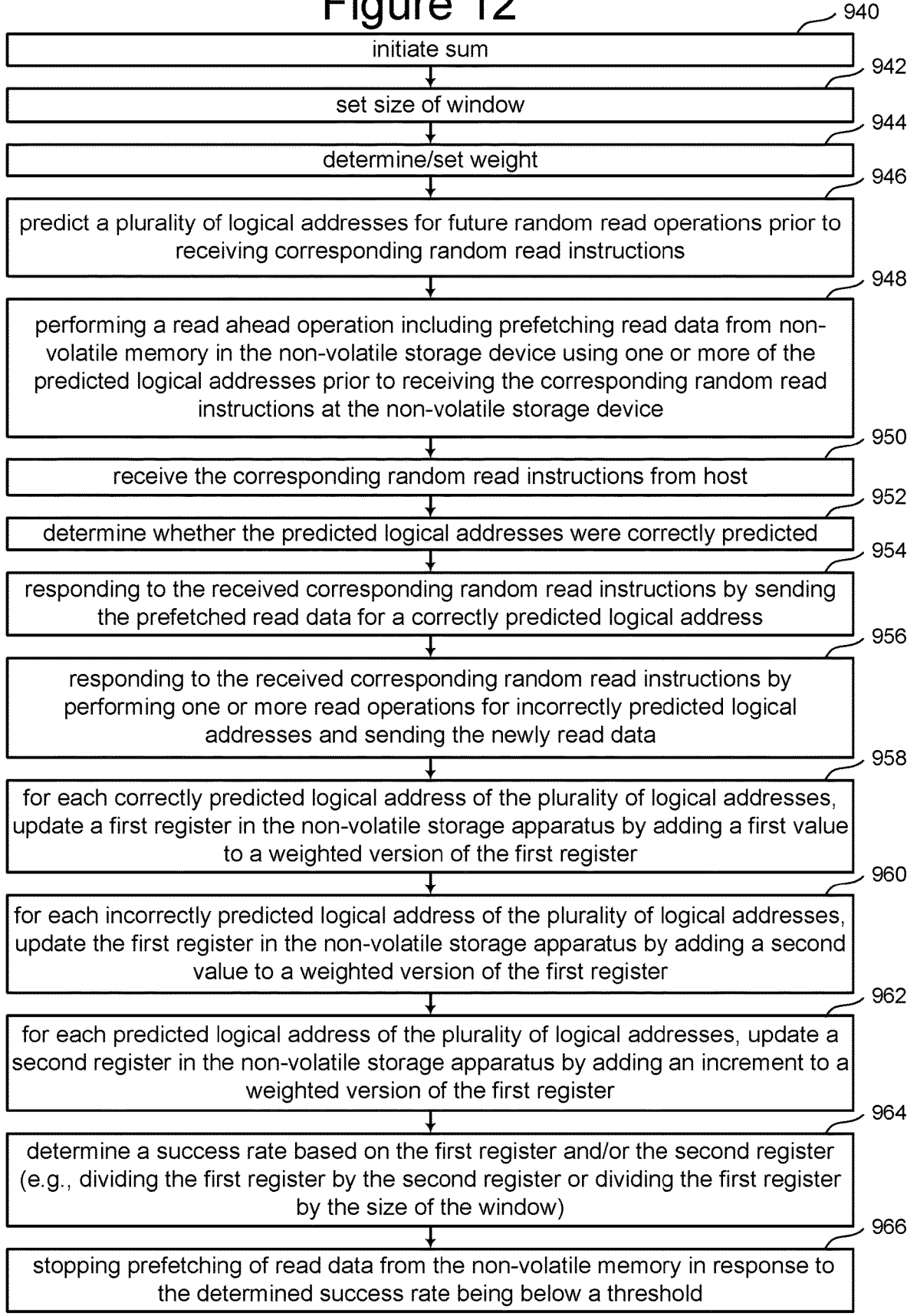

FIG. 12 is a flow chart describing one embodiment of a process for maintaining a sum of samples of a statistic about operation of the storage device.

Figure 13:
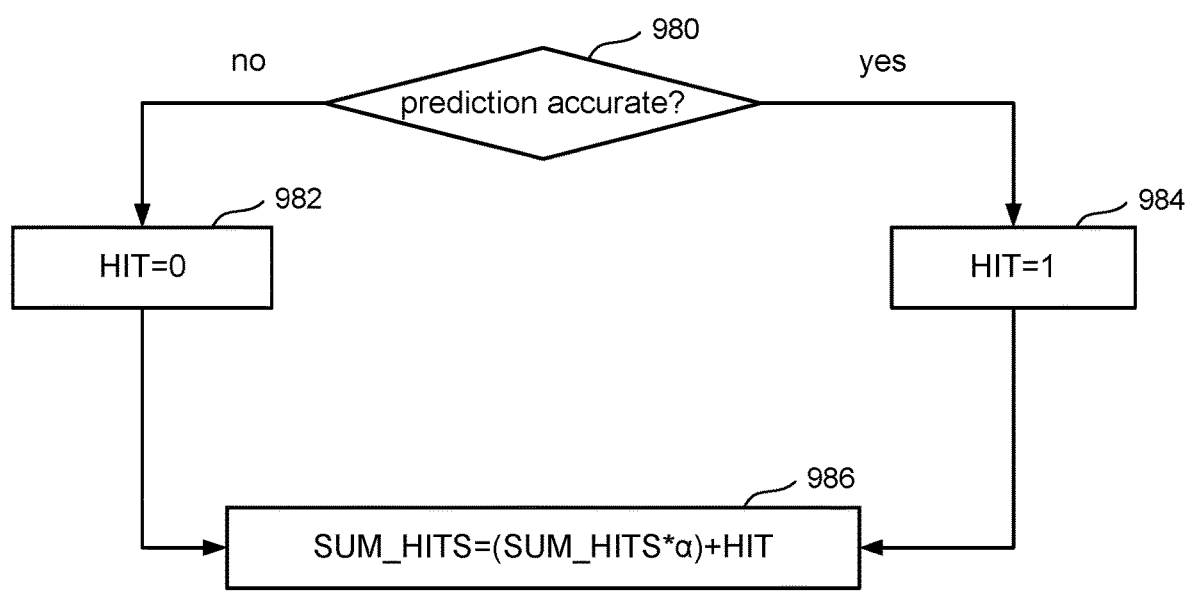

FIG. 13 is a flow chart describing one embodiment of a process for maintaining a sum of samples of a statistic about operation of the storage device.

DETAILED DESCRIPTION

Some non-volatile storage devices generate and/or monitor one or more statistics pertaining to operation of the non-volatile storage device. These statistics may be indicative of performance or health of the non-volatile storage device. For example, statistics about the performance of a non-volatile storage device can be used to adjust and improve that performance. Statistics about the health of a non-volatile storage device can be used to prevent errors or loss of data, as well as adjust and improve performance of the non-volatile storage device. However, storing large amounts of data to support the generation and monitoring of such statistics reduces capacity that can be used to store users' data. Additionally, devoting too much processing resources to the generation and monitoring of such statistics decreases performance of the non-volatile storage device.

To address the above-described issues, a non-volatile storage device is proposed that includes a compact and efficient filter of data samples for a monitored statistic about operation of the storage device. The non-volatile storage device comprises a plurality of non-volatile memory cells and a control circuit connected to the non-volatile memory cells. The control circuit is configured to maintain at the non-volatile storage device a sum of samples of the statistic for a moving window of the samples such that during operation new samples are added to the sum and contributions from old samples are removed from the sum by the control circuit multiplying the sum by a weight when adding the new samples.

FIG. 1A is a block diagram of one embodiment of a storage device 100 connected to a host 120 that can implement the technology proposed herein. Many different types of storage devices can be used with the technology proposed herein. One example of a storage device is a solid state drive ("SSD"); however, other types of storage devices can also be used. Storage device 100 comprises a controller 102, non-volatile memory 104 for storing data, and local memory 106 (e.g. DRAM. SRAM or ReRAM). In one embodiment, controller 102 comprises a Front End Processor (FEP) circuit 110 and one or more Back End Processor (BEP) circuits 112. In one embodiment FEP circuit 110 is implemented on an ASIC. In one embodiment, each BEP circuit 112 is implemented on a separate ASIC. In one embodiment, the ASICs for each of the BEP circuits 112 and the FEP circuit 110 are implemented on the same semiconductor such that the controller 102 is manufactured as a System on a Chip ("SoC"). FEP circuit 110 and BEP circuit 112 both include their own processors. In one embodiment, FEP circuit 110 and BEP circuit 112 work as a master slave configuration where the FEP circuit 110 is the master and each BEP circuit 112 is a slave. For example, FEP circuit 110 implements a flash translation layer that performs memory management (e.g., garbage collection, wear leveling, etc.), logical to physical address translation, communication with the host, management of DRAM (local memory 106) and management of the overall operation of the SSD (or other non-volatile storage device). BEP circuit 112 manages memory operations in the memory packages/die at the request of FEP circuit 110. For example, the BEP circuit 112 can carry out the read, erase and programming processes. Additionally, the BEP circuit 112 can perform buffer management, set specific voltage levels required by the FEP circuit 110, perform error correction (e.g., generate error correction code (ECC)), control the Toggle Mode interfaces to the memory packages, etc. In one embodiment, each BEP circuit 112 is responsible for its own set of memory packages. Controller 102 is one example of a control circuit.

In one embodiment, non-volatile memory 104 comprises a plurality of memory packages. Each memory package includes one or more memory die. Therefore, controller 102 is connected to one or more non-volatile memory die. In one embodiment, each memory die in the memory packages 104 utilize NAND flash memory (including two dimensional NAND flash memory and/or three dimensional NAND flash memory). In other embodiments, the memory package can include other types of memory.

Host 120 is one example of an entity that is external to storage device 100. For example, host 120 can be a computer, server, video camera, still camera, audio recorder, smart appliance, etc. that has storage device 100 embedded therein, or otherwise connected to storage device 100. Other examples of an entity that is external to storage device 100 include other computing devices (e.g., computers, servers, smart appliances, smart phones, etc.) that are connected to storage device 100 and other computing systems that are in communication with storage device 100 via any communication means (e.g., LAN, WAN, WiFi, wired connection, wireless connection, direct connection, indirect connection, etc.). Controller 102 communicates with host 120 via an interface 130 that implements NVM Express (NVMe) over PCI Express (PCIe). In one embodiment, the storage device implements the CFexpress standard.

In one embodiment, storage device 100 includes a statistical filter circuit 122. FIG. 1A shows statistical filter circuit 122 external to and connected to controller 102. In other embodiments, as described below, the statistical filter circuit is inside of (i.e., a component of) controller 102 or inside of (i.e., a component of) one or more of the memory packages 104. Statistical filter circuit 122 is used to maintain a sum of samples of a statistic that is a measure of operation of the non-volatile storage apparatus. In one set of embodiments, statistical filter circuit 122 maintains (at the storage device) a sum of samples of the statistic for a moving window of the samples such that during operation new samples are added to the sum and contributions from old samples are removed from the sum by multiplying the sum by a weight when adding the new samples. Statistical filter circuit 122 is in communication with any one or more of the processors within controller 102 to perform the functions described below. More details are explained below.

Controller 102 uses local memory 106 as a read buffer, as a write buffer, as a scratch pad and/or to store logical address to physical address translation tables ("L2P tables"). In many systems, the non-volatile storage is addressed internally to the memory system using physical addresses associated with the one or more memory die. However, the host system will use logical addresses to address the various memory locations. This enables the host to assign data to consecutive logical addresses, while the memory system is free to store the data as it wishes among the locations of the one or more memory die. To enable this system, controller 102 performs address translation between the logical addresses used by the host and the physical addresses used by the memory die. One example implementation is to maintain tables (e.g., the L2P tables mentioned above) that identify the current translation between logical addresses (such as logical block addresses, known as LBA's) and physical addresses (such as physical block addresses, known as PBA's). An entry in the L2P table may include an identification of a LBA and a corresponding PBA. In some examples, the memory space of a memory system is so large that the local memory 106 cannot hold all of the L2P tables. In such a case, the entire set of L2P tables are stored in the non-volatile storage and a subset of the L2P tables are cached (L2P cache) in the local memory. One statistic that is generated and reported by the technology described herein is hit rate for the L2P cache.

FIG. 1B is a block diagram of one embodiment of FEP circuit 110. FIG. 1B shows a PCIe interface 150 to communicate with host 120 and a host processor 152 in communication with that PCIe interface. The host processor 152 can be any type of processor known in the art that is suitable for the implementation. Host processor 152 is in communication with a network-on-chip (NOC) 154. A NOC is a communication subsystem on an integrated circuit, typically between cores in a SoC. NOCs can span synchronous and asynchronous clock domains or use unclocked asynchronous logic. NOC technology applies networking theory and methods to on-chip communications and brings notable improvements over conventional bus and crossbar interconnections. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). Connected to and in communication with NOC 154 is memory processor 156, SRAM 160 and DRAM controller 162. The DRAM controller 162 is used to operate and communicate with the DRAM (e.g., local memory 106). SRAM 160 is local RAM memory used by memory processor 156. Memory processor 156 is used to run the FEP circuit and perform the various memory operations. Also in communication with the NOC are two PCIe Interfaces 164 and 166. In the embodiment of FIG. 1B, the SSD controller includes two BEP circuits 112; therefore there are two PCIe Interfaces 164/166. Each PCIe Interface communicates with one of the BEP circuits 112. In other embodiments, there can be more or less than two BEP circuits 112; therefore, there can be more than two PCIe Interfaces.

In one embodiment, FEP circuit 110 includes statistical filter circuit 168 connected to NOC 154. In this embodiment, statistical filter circuit 168 is inside of (i.e., a component of) controller 102. By being connected to NOC 154, statistical filter circuit 168 can communicate with memory processor 156 to perform the functions discussed below. Statistical filter circuit 168 is used to maintain a sum of samples of a statistic that is a measure of operation of the non-volatile storage apparatus. In one set of embodiments, statistical filter circuit 168 maintains (at the storage device) a sum of samples of the statistic for a moving window of the samples such that during operation new samples are added to the sum and contributions from old samples are removed from the sum by multiplying the sum by a weight when adding the new samples. More details of statistical filter circuit 168 are explained below. Statistical filter circuit 168 is provided as part of FEP circuit 110 instead of or in addition to having statistical filter circuit 122 connected to controller 102 (see FIG. 1A).

FIG. 1C is a block diagram of one embodiment of the BEP circuit 112. FIG. 1C shows a PCIe Interface 200 for communicating with the FEP circuit 110 (e.g., communicating with one of PCIe Interfaces 164 and 166 of FIG. 2). PCIe Interface 200 is in communication with two NOCs 202 and 204. In one embodiment the two NOCs can be combined to one large NOC. Each NOC (202/204) is connected to SRAM (230/260), a buffer (232/262), processor (220/250), and a data path controller (222/252) via an XOR engine (224/254) and an ECC engine (226/256). The ECC engines 226/256 are used to perform error correction, as known in the art (e.g., encoding data to be written and decoding data that is read). The XOR engines 224/254 are used to XOR write data with previous data written so that the write data can be combined and stored in a manner that can be recovered in case there is a programming error. In one example, the XOR data is stored in DRAM 106 or in one of the memory die in the storage device. After the programming operation is complete, in order to verify that the programming operation was successful, the storage device may read the data page(s) that were programmed and/or data surrounding the newly programmed pages. If any of these read operations fail, the system may perform one or more XOR operations (or other logical/mathematical operations) on the stored combined data with the regions not currently programmed, thus recovering a safe copy of the original data to be programmed. The system may then locate a free region of memory on which to program the saved (recovered) copy.

Data path controller 222 is connected to an interface module for communicating via four channels with memory packages. Thus, the top NOC 202 is associated with an interface 228 for four channels for communicating with memory packages and the bottom NOC 204 is associated with an interface 258 for four additional channels for communicating with memory packages. Each interface 228/258 includes four Toggle Mode interfaces (TM Interface), four buffers and four schedulers. There is one scheduler, buffer and TM Interface for each of the channels. The processor can be any standard processor known in the art. The data path controllers 222/252 can be a processor, FPGA, microprocessor or other type of controller. The XOR engines 224/254 and ECC engines 226/256 are dedicated hardware circuits, known as hardware accelerators. In other embodiments, the XOR engines 224/254 and ECC engines 226/256 can be implemented in software. The scheduler, buffer, and TM Interfaces are hardware circuits.

FIG. 1D is a block diagram of one embodiment of a memory package 104 that includes a plurality of memory die 300 connected to a memory bus (command lines, data lines and chip enable lines) 294. The memory bus 294 connects to a Toggle Mode Interface 296 for communicating with the TM Interface of a BEP circuit 112 (see e.g. FIG. 1C). In some embodiments, the memory package can include a small controller or processor connected to the memory bus and the TM Interface. The memory package can have one or more memory die. In one embodiment, each memory package includes eight or sixteen memory die; however, other numbers of memory die can also be implemented. The technology described herein is not limited to any particular number of memory die.

FIGS. 1A-D provide one example architecture for a controller. However, the technology described herein is not limited to any specific form of the controller. Therefore, other architectures can be utilized for the controller. For example, other embodiments of a controller include microprocessors, microcontrollers, state machines, etc. in other configurations. In some cases, the controller can be inside the host. In other cases, the controller can be implemented on the memory die. Other options/configurations can also be used. A controller can also be referred to as a processor, even if it includes multiple processing cores, as the controller operates as a processor for the memory device.

FIG. 2 is a functional block diagram of one embodiment of a memory die 300. Each of the one or more memory die of FIG. 1D can be implemented as memory die 300 of FIG. 2. The components depicted in FIG. 2 are electrical circuits. In one embodiment, each memory die 300 includes a memory structure 326, control circuitry 310, and read/write circuits 328, all of which are electrical circuits. Memory structure 326 is addressable by word lines via a row decoder 324 and by bit lines via a column decoder 332. The read/write circuits 328 include multiple sense blocks 350 including SB1, SB2, . . . , SBp (sensing circuitry) and allow a page (or multiple pages) of data in multiple memory cells to be read or programmed in parallel. In one embodiment, each sense block include a sense amplifier and a set of latches connected to the bit line. The latches store data to be written and/or data that has been read. The sense blocks include bit line drivers.

Commands and data are transferred between the controller 102 and the memory die 300 via memory die interface 318. Examples of memory die interface 318 include a Toggle Mode Interface (e.g., Toggle Mode 2.0 JEDEC Standard or Toggle Mode 800) and an Open NAND Flash Interface (ONFI). Other I/O interfaces can also be used.

Control circuitry 310 cooperates with the read/write circuits 328 to perform memory operations (e.g., write, read, erase, and others) on memory structure 326. In one embodiment, control circuitry 310 includes a state machine 312, an on-chip address decoder 314, a power control circuit 316 and a statistical filter circuit 320. State machine 312 provides die-level control of memory operations. In one embodiment, state machine 312 is programmable by software. In other embodiments, state machine 312 does not use software and is completely implemented in hardware (e.g., electrical circuits). In some embodiments, state machine 312 can be replaced or augmented by a microcontroller or microprocessor. In one embodiment, control circuitry 310 includes buffers such as registers, ROM fuses and other storage devices for storing default values such as base voltages and other parameters.

The on-chip address decoder 314 provides an address interface between addresses used by controller 120 to the hardware address used by the decoders 324 and 332. Power control module 316 controls the power and voltages supplied to the word lines and bit lines during memory operations. Power control module 316 may include charge pumps for generating voltages.

FIG. 2 shows statistical filter circuit 320 inside of (i.e., a component of) memory die 300. Statistical filter circuit 320 can communicate with state machine 312 (or other components of control circuitry 310, such as another processor) to perform some of the functions discussed below. Statistical filter circuit 320 is used to maintain a sum of samples of a statistic that is a measure of operation of the non-volatile storage apparatus. In one set of embodiments, statistical filter circuit 320 maintains (at the storage device) a sum of samples of the statistic for a moving window of the samples such that during operation new samples are added to the sum and contributions from old samples are removed from the sum by multiplying the sum by a weight when adding the new samples. More details of statistical filter circuit 320 are explained below. Statistical filter circuit 320 is provided as part of memory die 300 instead of or in addition to having statistical filter circuit 122 external to and connected to controller 102 (see FIG. 1A) and/or inside of (i.e., a component of) controller 102 (see FIG. 1B).

For purposes of this document, control circuitry 310, alone or in combination with read/write circuits 328 and decoders 324/332, comprises a control circuit connected to memory structure 326. This control circuit is an electrical circuit that performs the functions described below. In other embodiments, the control circuit can consist only of controller 102 (or other controller), which is an electrical circuit in combination with software (e.g., firmware), that performs the functions described below. In one embodiment, the control circuit includes a controller where the controller is an electrical circuit that does not use software. In another alternative, the control circuit comprises controller 102 and (all or part of) control circuitry 310 performing the functions described below in the flow charts. In another embodiment, the control circuit comprises state machine 312 (and/or a microcontroller and/or a microprocessor) alone or in combination with controller 102. In another alternative, the control circuit comprises (all or a subset of) controller 102, control circuitry 310, read/write circuits 328 and decoders 324/332 performing the functions described below. In other embodiments, the control circuit comprises one or more electrical circuits that operate all or a portion of the non-volatile memory. In some embodiments, a statistical filter circuit (see e.g., statistical filter circuit 122, statistical filter circuit 168 and/or statistical filter circuit 320) that is internal to the memory die, internal to the controller or external to the controller is part of the control circuit.

The basic unit of storage in non-volatile memory systems is a memory cell. In some embodiments, memory cells store one bit of data and are referred to as Single Level Cells ("SLC"). A SLC memory cell can either be in an erased data state or a programmed data state. In other embodiments, memory cells store multiple bits of data and are referred to as Multi Level Cells ("MLC"). MLC memory cells can store two bits of data per memory cell, three bits of data per memory cell, four bits of data per memory cell, etc. A MLC memory cell can be in an erased data state or any one of multiple programmed data states. For example, a MLC memory cell that stores three bits of data (referred to as a three level cell—TLC), can be in an erased data state or any one of seven programmed data states. Memory structure 326 comprises a plurality of memory cells. In some examples, memory structure 326 comprises thousands or millions of memory cells.

In one embodiment, memory structure 326 comprises a monolithic three dimensional memory array of non-volatile memory cells in which multiple memory levels are formed above a single substrate. The memory structure may comprise any type of non-volatile memory that is monolithically formed in one or more physical levels of arrays of memory cells having an active area disposed above a silicon (or other type of) substrate. In one example, the non-volatile memory cells of memory structure 326 comprise vertical NAND strings with charge-trapping material such as described, for example, in U.S. Pat. No. 9,721,662, incorporated herein by reference in its entirety. In another embodiment, memory structure 326 comprises a two dimensional memory array of non-volatile memory cells. In one example, the non-volatile memory cells are NAND flash memory cells utilizing floating gates such as described, for example, in U.S. Pat. No. 9,082,502, incorporated herein by reference in its entirety. Other types of memory cells (e.g., NOR-type flash memory) can also be used.

The exact type of memory array architecture or memory cell included in memory structure 326 is not limited to the examples above. Many different types of memory array architectures or memory cell technologies can be used to form memory structure 326. No particular non-volatile memory technology is required for purposes of the new claimed embodiments proposed herein. Other examples of suitable technologies for memory cells of the memory structure 326 include ReRAM memories, magnetoresistive memory (MRAM), phase change memory (PCM), and the like. Examples of suitable technologies for architectures of memory structure 326 include two dimensional arrays, three dimensional arrays, cross-point arrays, stacked two dimensional arrays, vertical bit line arrays, and the like.

One example of a ReRAM, or PCMRAM, cross point memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electro-chemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a $Ge_2Sb_2Te_5$ alloy to achieve phase changes by electrically heating the phase change material. The doses of programming are electrical pulses of different amplitude and/or length resulting in different resistance values of the phase change material.

A person of ordinary skill in the art will recognize that the technology described herein is not limited to a single specific memory structure, but covers many relevant memory structures within the spirit and scope of the technology as described herein and as understood by one of ordinary skill in the art.

FIG. 3 depicts an example of memory structure 326. In one embodiment, memory structure 326 is an array of memory cells divided into two planes: plane 382 and plane 384. In other embodiments, more or less than two planes can be used. In some embodiments, each plane is divided into a number of memory erase blocks (e.g., blocks 0-1023, or another amount of blocks). In certain memory technologies (e.g. 2D/3D NAND and other types of flash memory), a memory erase block is the smallest unit of memory cells for an erase operation. That is, each memory erase block contains the minimum number of memory cells that are erased together in a single erase operation. Other units of erase can also be used. In other memory technologies (e.g. MRAM, PCM, etc.) used in other embodiments implementing the solution claimed herein, memory cells may be overwritten without an erase operation and so erase blocks may not exist.

Each memory erase block includes many memory cells. The design, size, and organization of a memory erase block depends on the architecture and design for the memory structure 326. As used herein, a memory erase block (or block) is a contiguous set of memory cells that share word lines and bit lines; for example, memory erase block i of FIG. 3 includes memory cells that share word lines WL0_i, WL1_i, WL2_i and WL3_i and share bit lines BL0-BL69,623.

In one embodiment, a memory erase block (see block i) contains a set of NAND strings which are accessed via bit lines (e.g., bit lines BL0-BL69,623) and word lines (WL0, WL1, WL2, WL3). FIG. 3 shows four memory cells connected in series to form a NAND string. Although four memory cells are depicted to be included in each NAND string, more or less than four memory cells can be used (e.g., 16, 32, 64, 128, 256 or another number or memory cells can be on a NAND string). One terminal of the NAND string is connected to a corresponding bit line via a drain side select gate, and another terminal is connected to the source line via a source side select gate. Although FIG. 3 shows 69,624 bit lines, a different number of bit lines can also be used.

Each memory erase block is typically divided into a number of pages. In one embodiment, a page is a unit of programming and a unit of reading. Other units of programming or reading can also be used. One or more pages of data are typically stored in one row of memory cells. For example, one or more pages of data may be stored in memory cells connected to a common word line. In one embodiment, a page includes data stored in all memory cells connected to a common word line. A page includes user data and overhead data (also called system data). Overhead data can include header information and Error Correction Code (ECC) information. Controller 102 (or other component) calculates the ECC information when data is being written into the array, and also checks it when data is being read from the array. In one embodiment, controller 102 encodes user data into code words as part of the ECC process during programming of the non-volatile memory and decodes the code words back to user data when reading from the non-volatile memory.

In the example discussed above, the unit of erase is a memory erase block and the unit of programming and reading is a page. Other units of operation can also be used. Data can be stored/written/programmed, read or erased a byte at a time, 1K bytes, 512K bytes, etc. No particular unit of operation is required for the claimed solutions described herein. In some examples, the system programs, erases, and reads at the same unit of operation. In other embodiments, the system programs, erases, and reads at different units of operation. In some examples, the system programs/writes and erases, while in other examples the system only needs to program/write, without the need to erase, because the system can program/write zeros and ones (or other data values) and can thus overwrite previously stored information.

Some non-volatile storage devices generate and/or monitor one or more statistics pertaining to operation of the non-volatile storage device. These statistics may be indicative of performance or health of the non-volatile storage device. For example, statistics about the performance of a non-volatile storage device can be used to adjust and improve that performance. Statistics about the health of a non-volatile storage device can be used to prevent errors or loss of data, as well as adjust and improve performance of the non-volatile storage device. Examples of statistics generated and/or monitored by a storage system include (but are not limited to) errors per page, time to complete performance of a command, bit error rate, operation failure rate, error correction code decoding time, number of bits needed to be flipped to converge on a decoded code word for error correction code decoding, programing/erase cycles, temperature spikes, cache hit rate, instruction prefetch success rate, address prediction success rate, host link reliability, etc.

Storing large amounts of data to support the generation and monitoring of such statistics reduces capacity that can be used to store a user's data. Additionally, devoting too much processing resources to the generation and monitoring of such statistics decreases performance of the non-volatile storage device. For example, consider an example where the storage device obtains multiple samples for a statistic being monitored. At some point, the storage device will determine the average value of that statistic. A trivial implementation for monitoring the statistic and generating the average value is achieved by maintaining two counters. A first counter stores the sum of the samples (CNT_SUM). The second counter stores an indication of the total number of samples (CNT_TOT). The storage device can calculate the average (AVG) by dividing the value stored in the first counter (CNT_SUM) by the value stored in the second counter (CNT_TOT):

$$AVG = \frac{CNT\_SUM}{CNT\_TOT}$$

This trivial implementation suffers from at least the following drawbacks. First, if the counters and the supporting logic is implemented in software/firmware on the controller or other processor, then to many clock cycles will be needed to perform the division; thereby, reducing performance of the storage device. Most non-volatile storage devices, such as SSDs and memory cards, are focused on read and write performance rather than capacity to perform computations. Therefore, to increase performance, it is desirable (in some embodiments, to implement the counters and the supporting logic in hardware (e.g., hardware accelerator). However, building a hardware divider requires significant gate count and operating a hardware divider will still consume too many clock cycles. Additionally, a hardware counter is limited by the number of implemented bits and will "explode" (reset back to zero) when exceeding the maximum supported value (e.g., a counter with 8 bits cannot count higher than 255 before cycling back to zero). Finally, the trivial implementation described above suffers from being limited to infinite history. That is, the trivial implementation described above does not allow for tracking the statistic over a limited history (e.g., 100 events back), but rather only monitors the overall statistic since the "beginning of life" of the storage device.

To address the above-described issues, a non-volatile storage device is proposed that includes a compact and efficient filter of data samples for a monitored statistic about operation of the storage device. This new proposed filter can be implemented in hardware only, software (including firmware) only, or a combination of hardware and software/firmware. For example, any one or more of statistical filter circuits 122, 168 or 320 are example embodiments of the proposed filter. This new proposed filter is configured to maintain at the non-volatile storage device a sum of samples of the statistic for a dynamically set moving window of the samples such that during operation new samples are added to the sum and contributions from old samples are removed from the sum by multiplying the sum by a weight when adding the new samples. By maintaining the sum for a moving window and using a weight, the counter (or register) storing the sum will not explode as describe above. By having the window be dynamically set, the non-volatile storage device can control the amount of history maintained (e.g., 100 samples, 1000 samples, 10000 samples, etc.). The window is a moving window because new samples are added and contributions from old samples are removed.

In one embodiment, the sum of samples (SOS) is expressed as:

$$SOS = SOS * \alpha + NS \qquad \text{Equation 1}$$

where NS is a new sample being added to the sum and $\alpha$ is the weight, such that the weight ($\alpha$) is defined as:

$$\alpha = \frac{(2^X - 1)}{2^X} \qquad \text{Equation 2}$$

In the above equations, $2^X$ is a power of two where X is the exponent. Thus, the weight ($\alpha$), which is a number greater than zero and less than one, comprises a multiple component function that includes a power of two in the numerator and the power of two in the denominator, such that the power of two ($2^X$) represents the size of the window (e.g., the amount of the history maintained) and X (the exponent) represents the number of integer bits implemented in the filter. Note that in addition to the integer bits, the filter may also include fractional bits (i.e. for floating point). In this implementation, the window of data represents a subset of all data added to the sum.

The sum of samples SOS is a dynamically updated value that gradually "forgets" the old values for the sake of new arriving events in order to prevent the counter/register from exploding (as described above). That is, as new samples (NS) are added to the sum SOS contributions from the older samples are removed by multiplying the sum SOS by the weight ($\alpha$). The storage device dynamically controls the size of the moving window (the mount of history being maintained) by adjusting X.

The proposed definition of the weight ($\alpha$) set forth above allows for a simple hardware (or software/firmware) implementation relying on shifters, rather than a complete multiplication circuit or a complete divisional circuit. That is, in one embodiment, the multiplying the sum of samples SOS by the weight ($\alpha$) is performed without using a multiplication circuit or a division circuit. Consider the following steps:

$$SOS * \alpha = SOS * \frac{(2^X - 1)}{2^X} = \frac{SOS * 2^X - SOS}{2^X} \qquad \text{Equation 3}$$

Multiplying SOS by $2^X$ can be completely performed by left shifting the binary form of SOS by X bits. Dividing by $2^X$ can be completely performed by right shifting the binary form of the difference ($SOS*2^X-SOS$) by X bits. Therefore, multiplying the sum of samples SOS by the weight ($\alpha$) comprises left shifting a current value of the sum of samples, subtracting the current value from the left shifted current value to create a difference value, and right shifting the difference value. As a result, one set of example embodiments for implementing the compact and efficient filter of data samples for a monitored statistic about operation of the storage device can use shift registers rather than multiplication circuits and/or division circuits. It is well known that shift registers are significantly smaller, faster and less complicated than complete multiplication circuits (circuits capable of multiplying any number by any number) and/or complete division circuits (circuits capable of diving any number by any number).

The storage device can use the sum of samples SOS to determine one or more metrics about the statistic being tracked, such as average value, median value, standard deviation, maximum value, minimum value, etc. For example, the storage device can determine an average value (one example of a metric) from dividing the sum of samples SOS by $2^X$, which can be performed by right shifting by X bits.

The metric calculated by the storage device can be reported to an entity external to the storage device (e.g., host 120) or can be used to adjust operation of the storage device. For example, if the metric is average ECC decoding time or bit error rate, the metric can be used to adjust the ECC encoding or decoding process to use a more or less aggressive error correction scheme. If the metric indicates the success rate of a prediction or prefetch scheme, a low success rate can be used to turn off the feature so that performance improves.

FIG. 4 is a high level block diagram of a non-volatile storage device 400 that implements the proposed compact and efficient filter of data samples for a monitored statistic about operation of the storage device. Non-volatile storage device 400 is connected to host 402, and includes control circuit 404 connected to a plurality of non-volatile memory cells 406. In open embodiment, non-volatile storage device 400 is equivalent to non-volatile storage device 100 of FIG. 1A and host 402 is equivalent to host 120 of FIG. 1A. Non-volatile memory cells 406 can be memory packages 104, memory die 300, memory structure 326 or a different arrangement of memory cells. Control circuit 404 can be any of the control circuits described above including (but not limited to) controller 102, control circuitry 310, state machine 312, a processor, a microprocessor, a microcontroller, FPGA, etc., or a combination of the above. FIG. 4 shows control circuit 404 including statistical filter circuit 408, which can be any one or more of statistical filter circuits 122, 168 or 320. Control circuit 404 (including statistical filter circuit 408) is configured to maintain at non-volatile storage device 400 a sum of samples of a statistic for a moving window of the samples such that during operation of non-volatile storage device 400 new samples are added to the sum and contributions from old samples are removed from the sum by control circuit 404 multiplying the sum by a weight when adding the new samples, as discussed above. The statistic is a measure of operation of the non-volatile storage device 400.

FIG. 5 is a flow chart describing one embodiment of a process for operating a non-volatile storage device including filtering of data samples and reporting a metric for a monitored operational statistic about operation of the storage device. Thus, the process of FIG. 5 is one embodiment for operating the system of FIG. 4. In step 502 of FIG. 5, control circuit 404 (e.g., including statistical filter circuit 408) maintains (at non-volatile storage device 400) a sum of samples of a statistic for a moving window of the samples such that during operation of non-volatile storage device 400 new samples are added to the sum and contributions from old samples are removed from the sum by control circuit 404 multiplying the sum by a weight when adding the new samples. In one embodiment, step 502 is performed continuously such that new samples are added to the sum as the data arises or is accessed.

If host 402 requests access to the operational statistic being monitored/generated (see step 504), then in step 508 control circuit 404 determines a metric for the statistic and control circuit 404 reports that metric to host 402 in step 510. For example, control circuit 404 may be monitoring bit error rate for read operations and step 502 comprises storing a sum of bit error rates for the last 100 read operations. When host 402 requests non-volatile storage device 400 to report the bit error rate, then in step 508 control circuit 404 calculates the average bit error rate and transmits that calculated average bit error rate via the host interface discussed above. In some embodiments, control circuit 404 determines a metric for the statistic without receiving a request from the host.

If host 402 does not request that the statistic be reported in step 504, then (e.g., periodically) control circuit 404 determines whether a threshold has been exceeded (step 506). If not, no action is taken (and the process loops back to sept 502). If a threshold has been exceeded, then in step 508 control circuit 404 determines a metric for the statistic and reports that metric to host 402 in step 510. One example, of a threshold for step 506 is whether a predetermine amount of time has elapsed since the last time the statistic was reported. Other examples of thresholds include whether the sum has exceeded a maximum value, whether the metric has exceeded a maximum or minimum value and/or whether a different type of data has exceeded a trigger value (e.g., temperature higher than a trigger, processing time too slow, error rate too high, etc.).

FIG. 6 is a flow chart describing another embodiment of a process for operating a non-volatile storage device including filtering of data samples and reporting a metric for a monitored statistic about operation of the storage device. Thus, the process of FIG. 6 is another embodiment for operating the system of FIG. 4. In step 548, control circuit 404 receives one or more instructions from host to configure one or more statistics. FIG. 6A is a flow chart describing one embodiment of a process for receiving one or more instructions from the host to configure one or more statistics. That is, the flow chart of FIG. 6A is one example implementation of step 548 of FIG. 6. In step 570 of FIG. 6A, control circuit 404 receives an indication of the values to track (e.g., what statistics needs to be monitored and/or generated). In step 572, control circuit 404 receives an indication of the size of the windows for each statistic. In step 574, control circuit 404 receives an indication of which weight to use for each statistic. In some cases, different statistics use different weights. In step 576, control circuit 404 receives an indication of the reporting strategy. For example, the one or more instructions may indicate to report periodically at a certain frequency, report when the statistic or metric exceeds an indicated threshold, or report only in response to a request from the host). The data received in steps 570-576 may all be received in one instruction or multiple instructions. In one embodiment, one instruction per statistic will provide the data for steps 570-576.

Looking back at FIG. 6, in step 550 control circuit 404 (e.g., including statistical filter circuit 408) maintains (at non-volatile storage device 400) a sum of samples of a statistic for a moving window of the samples such that during operation of non-volatile storage device 400 new samples are added to the sum and contributions from old samples are removed from the sum by control circuit 404 multiplying the sum by a weight when adding the new samples. In one embodiment, step 550 is performed continuously such that new samples are added to the sum as the data arises or is accessed. Step 550 of FIG. 6 is similar to step 502 of FIG. 5.

In step 552 of FIG. 6, control circuit 404 determines a metric for the statistic. Step 552 is similar to step 508 of FIG. 5. In one embodiment, steps 550 and 552 are performed together and continuously such that new samples are added to the sum and the metric is updated as the data arises or is accessed. In step 554, control circuit 404 reports to the host about the statistic(s) based on the sum of samples and in response to the one or more instructions from the host to configure the statistic(s). For example, control circuit 404 may report the metrics calculated in steps 552 according to the reporting strategy received in step 576.

FIG. 7 is a flow chart describing one embodiment of a process for maintaining a sum of samples of a statistic about operation of the storage device. That is, the process of FIG. 7 is one example implementation of step 502 of FIG. 5 or step 550 of FIG. 6. In one embodiment, the process of FIG. 7 is performed by control circuit 404. In one embodiment, a first portion of the process of FIG. 7 is performed by a processor within controller 102 and a second portion of the process of FIG. 7 is performed completely by a hardware accelerator circuit (e.g., statistical filter circuit 408).

In step 602 of FIG. 7, the sum of samples is set to an initial value. For example, the sum of samples is set to zero; however, other initial values can also be used. If the process of FIG. 7 is performed by an electrical circuit (e.g., statistical filter circuit 122, 168 or 320), then step 602 can include resetting a counter or loading the initial value into a register. For purposes of this document, a register is understood to mean a storage unit dedicated to a particular purpose and can be implemented by a set of flip flops, a set of latches, a dedicated portion of RAM, or similar structure. If the process of FIG. 7 is performed by software/firmware, then step 602 can include loading the initial value into a portion of RAM or a register associated with the processor programmed by the software/firmware.

Control circuit 404 (e.g., statistical filter circuit 408) is configured to maintain at non-volatile storage device 400 a sum of samples of a statistic for a moving window of the samples. In step 604, the size of that moving window (e.g., number of samples in the window) is set. In some embodiments, step 604 is optional or not performed. That is the size of the window can be preset to a default value or can be fixed. In one set of embodiments that use the weight ($\alpha$) described above, the size of the window is $2^X$ and X is the number of integer bits for storing the sum of samples; therefore, setting the window includes setting the number of bits used to store the sum of samples. In other embodiments, control circuit 404 can set the size of the window separately from setting the number of bits used to store the sum of samples.

In step 606, control circuit 404 determines or sets the weight. In one embodiment, the weight is a number set at a value that is greater than zero and less than one. In another set of embodiments, the weight comprises a multiple component function that includes a power of two in the numerator and the power of two in the denominator, as discussed above with respect to the weight ($\alpha$). In this latter set of embodiments for the weight ($\alpha$), the determining or setting the weight comprises setting the exponent X (which may comprise setting the number of bits in the sum and/or setting the size of the window). In some embodiments, step 606 is performed as part of step 604 if setting the size of the window also sets the weight (e.g., choosing the exponent X). In some embodiments, step 606 is not performed as the weight (whether it is a number or a function) is predetermined and cannot be changed.

In step 608, the non-volatile storage device 400 performs one or more memory operations including reading, writing/programming, erasing, and memory management functions (garbage collection, defragmentation, moving data, refreshing data, etc.). In step 610, control circuit 404 obtains one or more samples of the statistic being monitored or generated. For example, if step 608 included reading data, then step 610 may include recording the bit error rate for the data read or the time needed to decode (e.g., ECC decoding) the data read. Alternatively, if step 608 included writing data, then step 610 may include recording the time needed to complete the writing or an indication of whether a predicted address was correct.

In step 612, the sum of the samples is updated for a moving window of the samples such that during operation of non-volatile storage device 400 new samples are added to the sum and contributions from old samples are removed from the sum. In one embodiment, the updating of the sum of samples includes control circuit 404 multiplying the current sum by a weight (step 622) and then adding the new sample from step 610 to the product of the current sum and the weight (step 624), for example, according to Equation 1. After updating the sum in step 612, the process loops back to step 608 such that steps 608-612 are continuously performed.

FIG. 8 depicts one embodiment of a statistical filter circuit 700 than can be used to maintain at the non-volatile storage device 400 a sum of samples of a statistic of operation of the non-volatile storage device for a moving window (e.g., changing subset) of the samples such that during operation new samples are added to the sum and contributions from old samples are removed from the sum by multiplying the sum by a weight when adding the new samples. In one embodiment, statistical filter circuit 700 is an example of a hardware implementation of step 612 of FIG. 7. Additionally, statistical filter circuit 700 is one example embodiment of statistical filter circuits 122, 168, 320 and/or 408.

Statistical filter circuit 700 is an electrical circuit comprising register 702. The output of register 702 serves as the output (OUT) of statistical filter circuit 700 and is connected to the input of add/subtract circuit 704 and the input of bit shifting circuit 706. The input of register 702 serves as the input (IN) of statistical filter circuit 700, and is connected to the output of add/subtract circuit 704 and the output of bit shifting circuit 706. Add/subtract circuit 704 is used to add a number to the current value of register 702. Bit shifting circuit 706 is used to left shift and/or right shift the bits of register 702 such that register 702 operates as a shift register. In one embodiment, register 702, add/subtract circuit 704 and bit shifting circuit 706 are all connected to a clock signal (not depicted) for the non-volatile storage device. In one embodiment, register 702, add/subtract circuit 704 and bit shifting circuit 706 are controllable by and connected to one or more processors of control circuit 404. For example, Memory Processor 156 (or another entity) may use signal ctrl_0 to control register 702 (e.g., indicate when register 702 should update), signal ctrl_1 to control add/subtract circuit 704 (e.g., indicate whether to add or subtract and by how much), and signal ctrl_2 to control bit shifting circuit 706 (e.g., to indicate whether to left shift or right shift, and to indicate how many bits to shift by).

In one embodiment, statistical filter circuit 700 implements Equation 1 and register 702 includes two sets of flip flops (or latches or other components) such that register 702 can store a current value of the sum and an interim value, where the interim value is used to calculate the next value of the sum of samples. Equation 1 includes multiplying the current value of the sum of samples by the weight (SOS*α), and adding the new sample (+NS). The adding the new sample (+NS) is performed using add/subtract circuit 704. The multiplying the current value of the sum by the weight is performed, in one embodiment, according to the flow chart of FIG. 9. In step 752 of FIG. 9, statistical filter circuit 700 left shifts the current value of the sum by X bits using bit shifting circuit 706 (thereby multiplying SOS by $2^X$) and stores the result as the interim value in register 702. In step 754, statistical filter circuit 700 subtracts the current value of the sum stored in register 702 from the left shifted interim value to create a difference value that replaces the interim value in register 702. In step 756, the difference value from step 754 is right shifted by X bits using bit shifting circuit 706 (thereby dividing by $2^X$) and the result replaces the current value of the sum in register 702.

In one embodiment, as per FIGS. 8 and 9, multiplying the current value of the sum by the weight is performed without using a complete multiplication circuit or a complete division circuit. That is, circuits that do full multiplication (e.g., multiply by any number, not just a power of 2) and/or full division (e.g., divide by any number, not just a power of 2), are not used. This saves space (e.g., less gates) and time (e.g., less clock cycles).

In some of the embodiments discussed above, there is a ramp up period that comprises the time needed to fill up the window with samples (e.g., $2^X$ samples). Looking back to FIGS. 5 and 6, steps 508 and 552 include determining a metric. In one embodiment, the metric is an average value and the control circuit 404 calculates the average value by dividing the sum (e.g., stored in register 702) by the size of the window (e.g., $2^X$). However, during the ramp up period, when the sum represents less than $2^X$ samples, the control circuit 404 cannot calculate the average by dividing by $2^X$. Instead, the control circuit 404 can divide the sum of the samples (e.g., stored in register 702) by a measure of the number of samples represented in the sum of the samples (e.g., stored in register 702). Thus, some embodiments include the control circuit 404 maintaining a measure of the number of samples represented in the sum of the samples in a separate register or counter. In such embodiments, when performing step 508 of FIG. 5 or step 552 of FIG. 6 and calculating an average (or other relevant metric), control circuit 404 divides the sum of the samples (e.g., stored in register 702) by the measure of the number of samples represented in the sum of the samples as maintained in the separate register or counter. While the process of determining a metric, such as an average value, may require performing full division (rather than only shifting) in order to divide by the measure of the number of samples represented in the sum of the samples, the metric is rarely calculated as opposed to the sum of samples SOS being calculated for each new sample.

FIG. 10 is a flow chart describing a process for maintaining a sum of samples of a statistic about operation of the storage device for embodiments that maintain the measure of the number of samples represented in the sum of the samples (as described in the immediately above paragraph). The process of FIG. 10 is another example implementation of step 502 of FIG. 5 or step 550 of FIG. 6. The process of FIG. 10 can be performed by control circuit 404. In one embodiment, a first portion of the process of FIG. 10 is performed by a processor within controller 102 and a second portion of the process of FIG. 710 is performed completely by a hardware accelerator circuit (e.g., statistical filter circuit 408).

In step 802 of FIG. 10, the sum of samples is set to an initial value. Step 802 is similar to step 602. In step 804, the size of that moving window (e.g., number of samples in the window) is set. Step 804 is similar to step 604. In some embodiments, step 804 is optional or not performed. In step 806, the measure of the number of samples represented in the sum of the samples is set to an initial value (e.g., 0 or 1). The measure of the number of samples represented in the sum of the samples may be stored in a register or other memory element. In step 808, control circuit 404 determines or sets the weight. Step 808 is similar to step 606. In step 810, the non-volatile storage device 400 performs one or more memory operations including reading, writing/programming, erasing, and memory management functions (garbage collection, defragmentation, moving data, refreshing data, etc.). Step 810 is similar to step 608. In step 812, non-volatile storage device 400 obtains one or more samples of the statistic being monitored or generated. Step 812 is similar to step 610. In step 814, control circuit 404 updates the sum of the samples for a moving window of the samples such that during operation of non-volatile storage device 400 new samples are added to the sum and contributions from old samples are removed from the sum. Step 814 is similar to step 612. In one embodiment as per Equation 1, updating of the sum of samples includes control circuit 404 multiplying the current sum by a weight (step 822) and then adding the new sample from step 812 to product of the current sum and the weight (step 824).

In step 816, control circuit 404 updates the measure of the number of samples represented in the sum of the samples. In one embodiment, the measure of the number of samples (NOS) represented in the sum of the samples is updated according to Equation 4, such that control circuit 404 multiplies the measure of the number of samples (NOS) represented in the sum of the samples by the weight (step 832) and adds an increment (step 834).

$$NOS=NOS*\alpha+1 \qquad \text{Equation 4}$$

FIG. 11 depicts an electrical circuit 900 for maintain/updating the measure of the number of samples represented in the sum of the samples. In one embodiment, circuit 900 of FIG. 11 is included in statistical filter circuits 122, 168, 320 and/or 408 in addition to circuit 700. In one embodiment, circuit 900 of FIG. 11 performs step 816 of FIG. 10. Electrical circuit 900 comprises register 902. The output of register 702 serves as the output (OUT') of circuit 900 and is connected to the input of increment/subtract circuit 904 and the input of bit shifting circuit 906. The input of register 902 serves as the input (IN') of circuit 900, and is connected to the output of increment/subtract circuit 904 and the output of bit shifting circuit 906.

In one embodiment, register 902 includes two sets of flip flops (or latches or other components) such that register 902 can store a current value of the number of samples and an interim value of the number of samples. Increment/subtract circuit 704 is used to add a 1 to the current value of register 902 or subtract the current value of register 902 from the interim value of the number of samples. Bit shifting circuit 906 is used to left shift and/or right shift the bits of register 902 such that register 902 operates as a shift register. In one embodiment, register 902, increment/subtract circuit 904 and bit shifting circuit 906 are all connected to a clock signal (not depicted) for the non-volatile storage device. In one embodiment, register 902, increment/subtract circuit 904 and bit shifting circuit 906 are controllable by and connected to one or more processors of control circuit 404. For example, Memory Processor 156 (or another entity) may use signal ctrl_3 to control register 902 (e.g., indicate when register 902 should update), signal ctrl_4 to control increment/subtract circuit 904 (e.g., indicate whether to add or subtract and by how much), and signal ctrl_5 to control bit shifting circuit 906 (e.g., to indicate whether to left shift or right shift, and to indicate how many bits to shift by).

In one embodiment, circuit 900 implements Equation 4, which includes multiplying the current value of the number of samples by the weight (NOS*α), and incrementing by one. The incrementing by one is performed using increment/subtract circuit 904. The multiplying the current value of the number of samples by the weight is performed, in one embodiment, according to the flow chart of FIG. 9. In step 752 of FIG. 9, circuit 900 left shifts the current value of the number of samples by X bits using bit shifting circuit 906 (thereby multiplying NOS by $2^X$). and stores the result as the interim value in register 902. In step 754, circuit 900 subtracts the current value of the sum stored in register 902 from the left shifted interim value to create a difference value that replaces the interim value in register 902. In step 756, the difference value from step 754 is right shifted by X bits using bit shifting circuit 906 (thereby dividing by $2^X$) and the result replaces the current value of the number of samples in register 902.

One example for using the technology described above is in conjunction with the non-volatile storage device predicting addresses for future read commands. If successful, the predicting of a next read address can speed up time used to respond to a read command. For example, if the non-volatile storage device successfully predicts a future logical address for a read command, then the non-volatile storage device can translate the logical address to a physical address and prefetch the data prior to receiving the read command. Then when the read command is received from the host, the non-volatile storage device will return the read data much faster than if the translating and fetching of data all occurred after the read command is received from the host.

Read operations can be classified as sequential reads or random reads. Sequential read operations comprise multiple read operations for a sequence of logical addresses; therefore, it is somewhat easier to predict the next logical address in the sequence. Random read operations, however, are performed for a set of logical addresses that are not in sequence; for example, consecutive read commands include requests to read non-consecutive sequences of addresses. Because the addresses are not in a consecutive sequence, it is more difficult to predict the next logical address for a set of random read operations.

In one embodiment for predicting logical addresses for future random read operations, controller 102 generates a read address search sequence made up of a list of read addresses both for the current read command and for each of a predetermined number of read commands received sequentially prior to the current read command. The controller is configured to then predict a next read address, based on the pattern of read addresses in the read address search sequence, by a comparison of the generated read address search sequence to a prior read address data structure. The prior read address data structure includes a list of prior read addresses arranged in chronological order of time of receipt at the controller. When a sequential portion of the list of prior read address in the prior read address data structure matches the generated read address search sequence, the controller is configured to then retrieve a predicted address from a next, more recent in time, prior read address in the list of prior read addresses that is located adjacent the sequential portion that matches the read address search sequence.

In another embodiment for predicting logical addresses for future random read operations, controller 102 is configured to receive a current read command having a start logical block address (LBA) and a data length. The controller may be configured to then calculate a differential logical block address (DLBA) for the current read command, wherein the DLBA comprises a difference between the start LBA of the current read command and a start LBA of a last read command received prior to the current read command. The controller is also configured to store the DLBA and the data length for the current read command in a read command history datastore of prior received read commands. Each of the prior received read commands also includes respective DLBA information and data length information, and is arranged chronologically by time of receipt of each read command at the controller. Controller 102 is also arranged to generate a read command search sequence in local memory 106 that includes, arranged in chronological order by time of read command receipt, the DLBA for the current read command and a respective DLBA previously determined for each of a predetermined number of prior read commands. Controller 102 compares the generated read command search sequence to the read command history datastore and is configured to pre-fetch data from a predicted address when a sequential portion of the read command history datastore is determined by the controller to match the read command search sequence. The predicted location may be an address based on DLBA information of a next read command after the sequential portion of the read command history datastore matching the search sequence. Other strategies for predicting addresses of future commands/operations can also be used. More details about predicting logical addresses for future random read operations can be found in U.S. patent application Ser. No. 16/024,607, "System and Method for Predictive Read of Random Data," filed on Jun. 29, 2018, by Navon, Sharon, and Alrod, incorporated herein by reference in its entirety.

If successful, the predicting of a next read command can speed up time needed to respond to a read command. On the other hand, however, if the non-volatile storage device incorrectly predicts addresses of future read commands too often, then the costs (e.g., power and time) used to make the prediction is not justified; therefore, the non-volatile storage device should stop making the predictions. Therefore, the prediction of addresses of future read commands can benefit from tracking the statistical hit rate—meaning a numerical measure of the fraction of successful predictions events out of the overall prediction attempts. This tracking of the statistical hit rate can be performed using the technology described above for maintaining a sum of samples of a statistic for a moving window of the samples, where the statistic is the hit rate.

FIG. 12 is a flow chart describing a process for tracking the statistical hit rate of the non-volatile storage device's predicting of addresses for future random read operations, which is an example implementation of maintaining a sum of samples of a statistic about operation of the storage where each sample is an indication of whether a particular prediction of an address for a random read operation was correctly predicted. The process of FIG. 12 is another example implementation of step 502 of FIG. 5 or step 550 of FIG. 6. The process of FIG. 12 can be performed by control circuit 404. In one embodiment, a first portion of the process of FIG. 12 is performed by a processor within controller 102 and a second portion of the process of FIG. 12 is performed completely by a hardware accelerator circuit (e.g., statistical filter circuit 408).

In step 940 of FIG. 12, the sum of samples is dynamically set to an initial value (e.g., 0). Step 940 is similar to step 602 of FIG. 7. In step 942, the size of that moving window (e.g., number of samples in the window) is dynamically set. Step 942 is similar to step 604. In some embodiments, step 942 is optional or not performed. In step 944, control circuit 404 dynamically determines or sets the weight. Step 944 is similar to step 606. In some embodiments, step 944 is optional or not performed.

In step 946, control circuit 404 predicts a plurality of logical addresses for future random read operations prior to receiving corresponding random read instructions at the non-volatile storage device 100. In step 948, control circuit 404 performs a read ahead operation. In one embodiment, the read ahead operation includes prefetching read data from non-volatile memory 406/104/326 in the non-volatile storage device 100 using one or more of the predicted logical addresses (from step 946) prior to receiving the corresponding random read instructions at the non-volatile storage device.

In step 950, control circuit 404 receives the corresponding random read instructions from host 120 (which is one example of an entity external to non-volatile memory device 100). That is, host 120 sends one or more random read requests to non-volatile memory device 100. Each of the random read requests corresponds to one of the predicted logical addresses from step 946. In step 952, control circuit 404 determines whether the predicted logical addresses were correctly predicted (e.g., whether the predicted logical address matches the actual logical address). In step 954, control circuit 404 responds to the random read requests received in step 950 by sending the prefetched data (step 948) for correctly predicted logical addresses. In step 956, control circuit 404 responds to the random read requests received in step 950 by performing one or more read operations (including translating received logical addresses to physical addresses in the memory) for incorrectly predicted logical addresses. Newly read data from the read operations performed in step 956 is sent to the host 120. Steps 954 and 956 can be performed simultaneously or in a different order than depicted in FIG. 12.

For each correctly predicted logical address of the plurality of logical addresses, control circuit 404 updates a first register in the non-volatile storage apparatus by adding a first value to a weighted version of the first register in step 958. For example, the first register is register 702 of FIG. 8 and control circuit 404 performs steps 622 and 624 of FIG. 7 or steps 822 and 824 of FIG. 10 to implement Equation 1 (such that NS=1) using circuit 700 of FIG. 8. Thus, control circuit 404 calculates the weighted version of the current value of the first register (e.g., as per the process of FIG. 9) and adds 1.

For each incorrectly predicted logical address of the plurality of logical addresses, control circuit 404 updates the first register in the non-volatile storage apparatus by adding a second value to a weighted version of the first register in step 960. In one embodiment, the second value is zero. In other embodiments, the second value is a number other than zero. In one example implementation of step 960, control circuit 404 performs steps 622 and 624 of FIG. 7 or steps 822 and 824 of FIG. 10 to implement Equation 1 (such that NS=0) using circuit 700 of FIG. 8. Thus, control circuit 404 calculates the weighted version of the current value of the first register (e.g., as per the process of FIG. 9).

For each predicted logical address of the plurality of logical addresses, control circuit 404 updates a second register in the non-volatile storage apparatus by adding an increment to a weighted version of the first register in step 962. For example, the second register is register 902 of FIG. 11 and control circuit 404 performs steps 832 and 834 FIG. 10 to implement Equation 4 using circuit 900 of FIG. 11. Step 962 is performed for embodiments that maintains the number of samples (see FIG. 11). Other embodiments can skip step 962.

In step 964, control circuit 404 determines a success rate based on the first register and/or the second register. For example, control circuit divides the first register by the second register or divides the first register by the size of the window (e.g., $2^X$). As per the processes of FIGS. 5 and/or 6, the success rate can be sent to the host. Alternatively, the non-volatile storage device can automatically turn off the function of predicting logical addresses of future random read operations if the success rate is too low (e.g., below a threshold). In step 966, control circuit 404 stops performing the read ahead operations including prefetching read data of step 948 in response to the determined success rate (step 964) being below a threshold. In one embodiment, when the determined success rate (step 964) is below the threshold, control circuit 404 will continue to perform the predicting of logical addresses (without performing the read ahead operations of step 948) and determine the success rate. If the success rate rises above the threshold, then control circuit 404 will restart the performing of the read ahead operations of step 948.

FIG. 13 is a flow chart describing one embodiment of a process for determining whether the predicted logical addresses were correctly predicted and updating the first register accordingly (e.g., maintaining the sum of samples). That is, the process of FIG. 13 is one example implementation of steps 950, 952 and 954 of FIG. 12. In step 980 of FIG. 13, control circuit 404 determines whether a predicted logical address was correctly predicted. For example, control circuit 404 determines whether the predicted logical address matches the actual address of a random read command sent from host 120. If the prediction is accurate, then in step 982 the variable HIT is set as HIT=1. If the prediction was not accurate, then in step 984 the variable HIT is set as HIT=0. In step 986, after either of steps 982 or 984, the first register that is storing/maintaining the sum of samples (SUM_HITS) is updated based on Equation 5:

$$\text{SUM\_HITS} = (\text{SUM\_HITS} * \alpha) + \text{HIT} \qquad \text{Equation 5}$$

While some embodiments include a hardware acceleration circuits, such as circuits 700 and 900, other embodiments can be performed by firmware running on any one or more of the processors of controller 102. Below is an example of pseudo code for such firmware for performing all or part of the process of FIG. 12. Alternatively, the pseudo code can be used to explain the operation of circuits 700 and 900.

Pseudo Code
// Dynamically set size of window and set weight
//X: 3≤X≤16
X=16 \\ for example
// Initialization
SUM_HITS=0
TOT_PREDICTION=0
alpha=$(2^X-1)/2^X$
//Calculation at each new prediction
SUM_HITS=SUM_HITS*alpha=HIT //HIT=1 if prediction is correct
TOT_PREDICTION=TOT_PREDICTION*alpha+1
//Output Hit Rate, which is the success rate of the predicting of addresses SUCCESS_RATE=SUM_HITS/TOT_PREDICTION A non-volatile storage device has been described that includes a compact and efficient filter of data samples for a monitored statistic about operation of the storage device.

One embodiment includes a non-volatile storage apparatus comprising a plurality of non-volatile memory cells and a control circuit connected to the non-volatile memory cells. The control circuit is configured to maintain at the non-volatile storage apparatus a sum of samples of a statistic for a moving window of the samples such that during operation new samples are added to the sum and contributions from old samples are removed from the sum by the control circuit multiplying the sum by a weight when adding the new samples. The statistic is a measure of operation of the non-volatile storage apparatus. The weight is greater than zero and less than one.

One embodiment includes a method for operating a non-volatile storage device comprising: predicting a plurality of logical addresses at the non-volatile storage device for future random read operations prior to receiving corresponding random read instructions; receiving the corresponding random read instructions at the non-volatile storage device from an entity external to the non-volatile storage device; determining whether the predicted logical addresses were correctly predicted; for each correctly predicted logical address of the plurality of logical address, updating a first register in the non-volatile storage device by adding a first value to a weighted version of the first register; for each incorrectly predicted logical address of the plurality of logical address, updating the first register by adding a second value to the weighted version of the first register, the second value is different than the first value; and determining a success rate based on the first register. The second value can be zero or another integer that is different than the first value.

One embodiment includes a method for operating a nonvolatile storage apparatus comprising performing one or more operations at the non-volatile storage apparatus, obtaining samples of a statistic about the one or more operations at the nonvolatile storage apparatus, and maintaining at the non-volatile storage apparatus a sum of samples of the statistic for a moving window of the samples such that during operation new samples are added to the sum and contributions from old samples are removed from the sum by the non-volatile storage apparatus multiplying the sum by a weight when adding the new samples. The weight is greater than zero and less than one. In one embodiment, the sample is a determination of whether a predicted logical address was correctly predicted.

One embodiment includes a non-volatile storage apparatus, comprising a memory die including a plurality of non-volatile memory cells and a controller connected to the memory die. The controller is configured to receive one or more instructions from a host to configure a statistic about operation of the non-volatile storage apparatus. The controller comprises means for maintaining a sum of samples of the statistic for a changing subset of the samples by multiplying the sum by a weight when adding a new sample in response to the one or more instructions. The controller is configured to report about the statistic to the host based on the sum of samples and in response to the one or more instructions.

In some embodiments, the means for maintaining a sum of samples of the statistic for a changing subset of the samples by multiplying the sum by a weight when adding a new sample can be hardware only or hardware in combination with software, including statistical filter circuit 122, statistical filter circuit 168, statistical filter circuit 320, statistical filter circuit 408, statistical filter circuit 700, statistical filter circuit 700 in combination with controller 102, controller 102 running software or firmware (e.g., see pseudo code above), state machine 312, and/or control circuitry 310 performing all or portions of the processes of FIGS. 7, 9, 10, 12 and/or 13. In other embodiments, the means for maintaining a sum of samples of the statistic for a changing subset of the samples by multiplying the sum by a weight when adding a new sample can be a general purpose processor, microprocessor, controller, microcontroller, or state machine that performs all or portions of the processes of FIGS. 7, 9, 10, 12 and/or 13.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects. For example, the terms "first" and "second" in the phrases first register and second register are used as identification labels to distinguish the register and are not meant to indicate an order or priority.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A non-volatile storage apparatus, comprising:
   a plurality of non-volatile memory cells; and
   a control circuit connected to the non-volatile memory cells, the control circuit is configured to maintain at the non-volatile storage apparatus a sum of samples of a statistic for a moving window of the samples such that during operation new samples are added to the sum and contributions from old samples are removed from the sum by the control circuit multiplying the sum by a weight when adding the new samples, the statistic is a measure of operation of the non-volatile storage apparatus, the weight is greater than zero and less than one.

2. The non-volatile storage apparatus of claim 1, wherein:
   the control circuit is configured to maintain a measure of a number of samples represented in the sum of the samples by adding an increment to a weighted version of the measure of the number of samples; and
   the control circuit is configured to determine a metric of the statistic by dividing the sum of samples by the measure of the number of samples.

3. The non-volatile storage apparatus of claim 1, wherein:
   the window of samples represents a subset of all data added to the sum;
   the weight comprises a multiple component function that includes a power of two in a numerator and the power of two in the denominator, the power of two is defined by an exponent;
   the power of two defines a size of the window; and
   the control circuit is configured to determine a metric of the statistic by dividing the sum by the power of two.

4. The non-volatile storage apparatus of claim 3, wherein:
   the control circuit is configured to dynamically adjust a size of the moving window of the samples by changing the exponent.

5. The non-volatile storage apparatus of claim 1, wherein:
   the control circuit is configured to multiply the sum of samples by the weight when adding new samples by left shifting a current value of the sum, subtracting from the left shifted current value to create a difference value and right shifting the difference value.

6. The non-volatile storage apparatus of claim 1, wherein:
   the control circuit comprises a register, a bit shifting circuit configured to shift bits of the register and an add/subtract circuit configured to add/subtract to/from the register; and
   the control circuit is configured to multiply the sum of samples by the weight when adding new samples by the bit shifting circuit left shifting a current value of the register, the add/subtract circuit subtracting from the left shifted current value to create a difference value and the bit shifting circuit right shifting the difference value.

7. The non-volatile storage apparatus of claim 6, wherein:
   the plurality of non-volatile memory cells are on a memory die;
   the control circuit includes a memory controller separate from and connected to the memory die; and
   the memory controller includes a host interface configured to communicate with an entity external to the non-volatile storage apparatus and a memory interface configured to communicate with the memory die, the register and the bit shifting circuit are positioned between the host interface and the memory interface.

8. The non-volatile storage apparatus of claim 1, wherein:
   the control circuit comprises a first register, a first bit shifting circuit configured to shift bits of the first register, a first add/subtract circuit configured to add to and subtract from the first register, a second register, a second bit shifting circuit configured to shift bits of the second register and a second add/subtract circuit configured to add to and subtract from the second register;
   the first register is configured to store the sum of samples;
   the second register is configured to maintain a measure of a number of samples in the moving window;
   the control circuit is configured to multiply the sum of samples by the weight when adding new samples by the first bit shifting circuit left shifting a current value of the first register, the first add/subtract circuit subtracting from the left shifted current value to create a first difference value and the first bit shifting circuit right shifting the first difference value;

the control circuit is configured to maintain the measure of the number of samples in the moving window by the second bit shifting circuit left shifting a current value of the second register, the second add/subtract circuit subtracting from the left shifted current value of the second register to create a second difference value, the second bit shifting circuit right shifting the second difference value, and the second add/subtract circuit adding one to the right shifted second difference value; and the control circuit is configured to determine a metric of the statistic by dividing the first register by the second register.

9. The non-volatile storage apparatus of claim 1, wherein:
the control circuit is configured to:
  predict a plurality of logical addresses at the non-volatile storage apparatus for future random read operations prior to receiving corresponding random read instructions,
  receive the corresponding random read instructions at the non-volatile storage apparatus from an entity external to the non-volatile storage apparatus, and
  determine whether the predicted logical addresses were correctly predicted;
the statistic is a hit rate of whether the predicted logical addresses were correctly predicted;
the control circuit is configured to multiply the sum of samples by the weight when adding the new samples by:
  for each correctly predicted logical address of the plurality of logical addresses, updating the sum of samples by adding a first value to a weighted version of the sum of samples, and
  for each incorrectly predicted logical address of the plurality of logical addresses, updating the sum of samples by multiplying the sum of samples by the weight.

10. The non-volatile storage apparatus of claim 1, wherein:
the control circuit is configured to determine a metric for the statistic based on the sum of samples and report the metric to an entity external to the non-volatile storage apparatus.

11. The non-volatile storage apparatus of claim 1, wherein:
the control circuit is configured to receive one or more instructions from a host to configure the statistic;
the control circuit is configured to maintain the sum of samples in response to the one or more instructions from the host to configure the statistic; and
the control circuit is configured to report to the host about the statistic based on the sum of samples and in response to the one or more instructions from the host to configure the statistic.

12. A method for operating a non-volatile storage device, comprising:
predicting a plurality of logical addresses at the non-volatile storage device for future random read operations prior to receiving corresponding random read instructions at the non-volatile storage device;
receiving the corresponding random read instructions at the non-volatile storage device from an entity external to the non-volatile storage device;
determining whether the predicted logical addresses were correctly predicted;
for each correctly predicted logical address of the plurality of logical addresses, updating a first register in the non-volatile storage device by adding a first value to a weighted version of the first register;
for each incorrectly predicted logical address of the plurality of logical addresses, updating the first register by adding a second value to the weighted version of the first register, the second value is different than the first value; and
determining a success rate based on the first register.

13. The method of claim 12, wherein:
the updating the first register by adding the first value to the weighted version of the first register includes calculating the weighted version of the first register;
the updating the first register by adding the second value to the weighted version of the first register includes calculating the weighted version of the first register; and
the calculating the weighted version of the first register comprises multiplying a current value of the first register by a weight that is between zero and one.

14. The method of claim 13, wherein:
the multiplying the current value of the first register by the weight comprises left shifting the current value of the first register, subtracting from the left shifted current value to create a difference value and right shifting the difference value.

15. The method of claim 13, wherein:
the multiplying the current value of the first register by the weight is performed without using a complete multiplication circuit or a complete division circuit; and
the second value is equal to zero.

16. The method of claim 12, wherein:
the first register maintains a moving window of data representing a subset of all data added to the first register;
the weight comprises a multiple component function that includes a power of two in a numerator and the power of two in the denominator, the power of two is defined by an exponent;
the power of two defines the window, the determining the success rate based on the first register comprises dividing the first register by the power of two; and
the method comprises dynamically setting the exponent.

17. The method of claim 12, further comprising:
for each correctly predicted logical address of the plurality of logical address and for each incorrectly predicted logical address of the plurality of logical address, updating a second register in the non-volatile storage device by adding an increment to a weighted version of the second register, the determining the success rate based on the first register comprises dividing the first register by the second register.

18. The method of claim 12, further comprising:
performing a read ahead operation including prefetching read data from non-volatile memory in the non-volatile storage device using one or more of the predicted logical addresses prior to receiving the corresponding random read instructions at the non-volatile storage device;
responding to the received corresponding random read instructions by sending the prefetched read data for a correctly predicted logical address; and stopping prefetching of read data from the non-volatile memory in response to the determined success rate being below a threshold.

19. A non-volatile storage apparatus, comprising:

a memory die comprising a plurality of non-volatile memory cells; and a controller connected to the memory die, the controller is configured to receive one or more instructions from a host to configure a statistic about operation of the non-volatile storage apparatus, the controller comprises means for maintaining a sum of samples of the statistic for a changing subset of the samples by multiplying the sum by a weight when adding a new sample in response to the one or more instructions, the controller is configured to report about the statistic to the host based on the sum of samples and in response to the one or more instructions.

20. The non-volatile storage apparatus of claim 19, wherein:

the one or more instructions from the host to configure the statistic comprise an indication of the statistic, an indication of the size of the subset, an indication of the weight and an indication of reporting strategy.

* * * * *